United States Patent
Tsukuda et al.

(10) Patent No.: US 11,912,612 B2
(45) Date of Patent: Feb. 27, 2024

(54) PLATING FILM AND PLATING FILM PRODUCTION METHOD

(71) Applicants: OKUNO CHEMICAL INDUSTRIES CO., LTD., Osaka (JP); PANASONIC HOLDINGS CORPORATION, Kadoma (JP)

(72) Inventors: Mayu Tsukuda, Osaka (JP); Toshimitsu Nagao, Osaka (JP); Junichi Katayama, Osaka (JP); Kazuya Shimada, Suita (JP); Masahito Hayamizu, Suita (JP); Toshihiko Sakata, Suita (JP); Shuhei Fuku, Suita (JP); Asuka Hirooka, Suita (JP)

(73) Assignees: OKUNO CHEMICAL INDUSTRIES CO., LTD., Osaka (JP); PANASONIC HOLDINGS CORPORATION, Kadoma (JP)

( * ) Notice: Subject to any disclaimer, the term of this patent is extended or adjusted under 35 U.S.C. 154(b) by 0 days.

(21) Appl. No.: 18/031,512

(22) PCT Filed: Jun. 1, 2022

(86) PCT No.: PCT/JP2022/022268
§ 371 (c)(1),
(2) Date: Apr. 12, 2023

(87) PCT Pub. No.: WO2022/270253
PCT Pub. Date: Dec. 29, 2022

(65) Prior Publication Data
US 2023/0391664 A1 Dec. 7, 2023

(30) Foreign Application Priority Data
Jun. 24, 2021 (JP) .................. 2021-105229
Jan. 13, 2022 (JP) .................. 2022-003941

(51) Int. Cl.
*C03C 17/36* (2006.01)

(52) U.S. Cl.
CPC ...... *C03C 17/3618* (2013.01); *C03C 17/3639* (2013.01); *C03C 17/3697* (2013.01); *C03C 2217/253* (2013.01); *C03C 2218/115* (2013.01)

(58) Field of Classification Search
CPC ............ C03C 17/3618; C03C 17/3639; C03C 17/3697
See application file for complete search history.

(56) References Cited

U.S. PATENT DOCUMENTS

| 6,689,645 B2 | 2/2004 | Houng et al. |
| 2002/0102775 A1 | 8/2002 | Houng et al. |
| (Continued) | | |

FOREIGN PATENT DOCUMENTS

| CN | 1716391 A | 1/2006 |
| CN | 1745194 A | 3/2006 |
| (Continued) | | |

OTHER PUBLICATIONS

International Search Report dated Aug. 16, 2022, issued in counterpart International Application No. PCT/JP2022/022268 (3 pages).
(Continued)

*Primary Examiner* — Cynthia Szewczyk
(74) *Attorney, Agent, or Firm* — WHDA, LLP

(57) ABSTRACT

The present invention provides a plating film that exhibits good adhesion to glass substrates. The present invention is a plating film comprising an oxide layer, an electroless plating film, and an electrolytic copper plating film in this order.

14 Claims, 3 Drawing Sheets

(56) References Cited

U.S. PATENT DOCUMENTS

| | | |
|---|---|---|
| 2002/0123176 A1 | 9/2002 | Izumi et al. |
| 2005/0287304 A1 | 12/2005 | Iso et al. |
| 2007/0042125 A1 | 2/2007 | Yabe et al. |
| 2015/0159274 A1 | 6/2015 | Fels et al. |
| 2020/0404781 A1 | 12/2020 | Furushou et al. |

FOREIGN PATENT DOCUMENTS

| | | | |
|---|---|---|---|
| CN | 101030536 A | * 9/2007 | ............ C03C 17/42 |
| CN | 107709262 A | 2/2018 | |
| JP | 7-309638 A | 11/1995 | |
| JP | 8-144061 A | 6/1996 | |
| JP | 2000500161 A | * 1/2000 | |
| JP | 2001-32086 A | 2/2001 | |
| JP | 3694901 B2 | * 9/2005 | |
| JP | 2008-007800 A | 1/2008 | |
| JP | 2008-255460 A | 10/2008 | |
| JP | 2009-024203 A | 2/2009 | |
| JP | 2015-509146 A | 3/2015 | |
| JP | 6917587 B1 | 8/2021 | |
| TW | 478062 B | 3/2002 | |
| WO | 2005/038086 A1 | 4/2005 | |
| WO | 2013/113810 A2 | 8/2013 | |
| WO | 2019/188843 A1 | 10/2019 | |

OTHER PUBLICATIONS

Decision to Grant a Patent dated Dec. 13, 2022, issued in counterpart JP Patent Application No. 2022-567694, w/English translation (4 pages).

Office Action dated Oct. 12, 2023, issued in counterpart CN application No. 202280008292.6, with English translation. (12 pages).

* cited by examiner

PLATING FILM AND PLATING FILM PRODUCTION METHOD

TECHNICAL FIELD

The present invention relates to a plating film and a method for producing a plating film.

BACKGROUND ART

Printed wiring boards are used in electronic devices. In such a printed wiring board, a circuit is generally formed by performing electroless plating (Ni, Cu, etc.) on a base material, followed by copper sulfate plating. Furthermore, the base material is subjected to plating such as Ni plating or Au plating, and soldering, thereby forming a printed wiring board.

In recent years, the communication speed of electronic devices has been increasing, and high frequency is used to increase the communication speed. Thus, smoothness is important for base materials on which wiring is formed. When a smooth base material such as a glass substrate is subjected to plating, it is required to deposit plating and improve the adhesion of the plating.

Patent Literature (PTL) 1 discloses an electroless plating method for forming an electroless nickel plating film on the surface of a polyimide resin substrate used for conductor circuits. However, in the electroless plating method disclosed in PTL 1, the adhesion of plating to base materials with a smooth surface is not taken into consideration, and the adhesion to glass substrates is not sufficient.

CITATION LIST

Patent Literature

PTL 1: JP2008-255460A

SUMMARY OF INVENTION

Technical Problem

An object of the present invention is to provide a plating film that exhibits good adhesion to glass substrates.

Solution to Problem

The present inventors conducted extensive research to achieve the above object, and found that the object is achieved by a plating film comprising an oxide layer, an electroless plating film, and an electrolytic copper plating film in this order. The present invention has been thus accomplished.

Specifically, the present invention relates to the following plating film and method for producing a plating film.

1. A plating film comprising an oxide layer, an electroless plating film, and an electrolytic copper plating film in this order.
2. The plating film according to Item 1, wherein the electroless plating film is an electroless nickel-phosphorus plating film.
3. The plating film according to Item 2, wherein the electroless nickel-phosphorus plating film has a phosphorus content of 4 mass % or more based on the electroless nickel-phosphorus plating film taken as 100 mass %.
4. The plating film according to Item 2 or 3, wherein the electroless nickel-phosphorus plating film has a thickness of 0.5 μm or more.
5. The plating film according to Item 1, wherein the electroless plating film is an electroless copper plating film.
6. The plating film according to Item 5, wherein the electroless copper plating film has an average crystal grain size of 500 nm or less.
7. The plating film according to any one of Items 1 to 6, wherein the oxide layer comprises at least one element selected from the group consisting of titanium, silicon, tin, zirconium, zinc, nickel, indium, vanadium, chromium, manganese, iron, cobalt, and copper.
8. A plated article comprising an oxide layer, an electroless plating film, and an electrolytic copper plating film in this order on a glass substrate.
9. A method for producing a plating film to be formed on a glass substrate, comprising:
    (1) step 1 of bringing a reaction solution containing fluorine and an oxide precursor into contact with a surface of a glass substrate to form an oxide layer on the glass substrate;
    (2) step 2 of removing fluorine in the oxide layer;
    (3) step 3 of adding catalysts to the oxide layer;
    (4) step 4 of forming an electroless plating film on the oxide layer to which the catalysts have been added; and
    (5) step 5 of forming an electrolytic copper plating film on the electroless plating film.
10. The method for producing a plating film according to Item 9, wherein removing fluorine in step 2 is at least one step selected from the group consisting of a step of annealing the oxide layer and a step of bringing the oxide layer into contact with an alkaline solution.
11. The method for producing a plating film according to Item 9 or 10, wherein the electroless plating film is an electroless nickel-phosphorus plating film.
12. A method for producing a plating film to be formed on a glass substrate, comprising:
    (I) step I of bringing a reaction solution containing fluorine and an oxide precursor into contact with a surface of a glass substrate to form an oxide layer on the glass substrate;
    (II) step II of adding a catalyst to the oxide layer;
    (III) step III of removing fluorine in the oxide layer to which the catalyst has been added;
    (IV) step IV of forming an electroless plating film on the oxide layer to which the catalyst has been added; and
    (V) step V of forming an electrolytic copper plating film on the electroless plating film.
13. The method for producing a plating film according to Item 12, wherein removing fluorine in step III is at least one step selected from the group consisting of a step of annealing the oxide layer to which the catalyst has been added and a step of bringing the oxide layer to which the catalyst has been added into contact with an alkaline solution.
14. The method for producing a plating film according to Item 12 or 13, wherein the electroless plating film is an electroless copper plating film.

Advantageous Effects of Invention

The plating film of the present invention can exhibit good adhesion to glass substrates. Moreover, the method for producing a plating film of the present invention makes it possible to produce a plating film that exhibits good adhesion on glass substrates.

BRIEF DESCRIPTION OF DRAWINGS

FIG. 1 is an SEM image of an interface portion (up to 300 nm from the interface) between an oxide layer and an electroless plating film on a glass substrate.

FIG. 2 is an enlarged view of crystal grains in FIG. 1.

DESCRIPTION OF EMBODIMENTS

Figure 1:
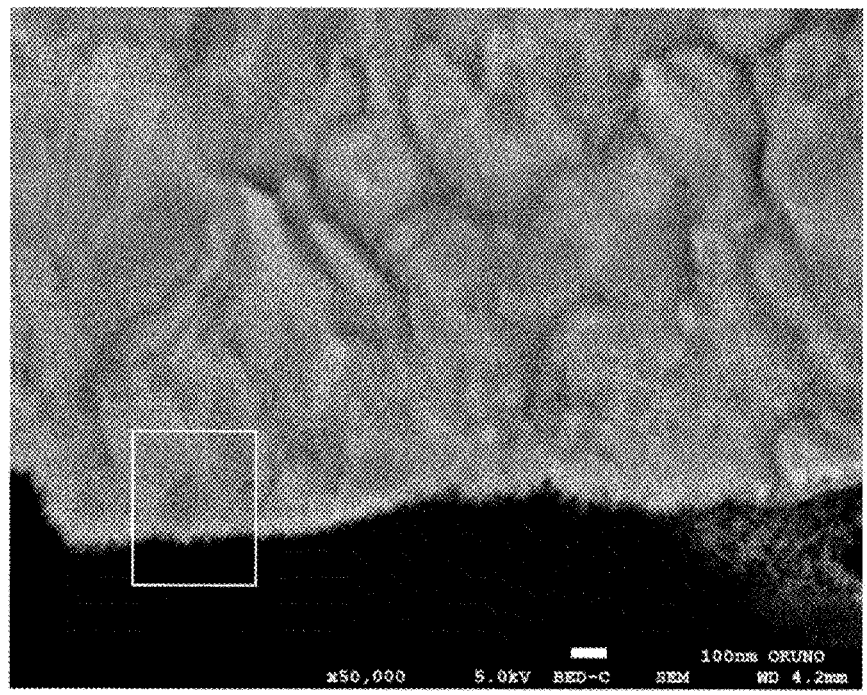
FIG. 1 shows a method for measuring the crystal grain size of an electroless plating film.

The present invention is described in detail below.

In the plating film of the present invention, the surface (the electrolytic copper plating film side) opposite to the oxide layer side (the side to be laminated on a glass substrate) is the surface to be viewed. In the present specification, the direction of the surface on the electrolytic copper plating film side may be referred to as "above" or "the front surface"; and the opposite direction, that is, the direction of the surface on the oxide layer side, may be referred to as "below" or "the back surface."

1. Plating Film

The plating film of the present invention comprises an oxide layer, an electroless plating film, and an electrolytic copper plating film in this order. The plating film of the present invention comprises the oxide layer as a layer to be brought into contact with a glass substrate and has excellent adhesion between the oxide layer and a glass substrate. The plating film of the present invention comprises the electroless plating film and the electrolytic copper plating film in this order on the oxide layer and thus has excellent adhesion between these layers. Therefore, the plating film of the present invention can exhibit excellent adhesion to glass substrates.

Oxide Layer

The oxide that forms the oxide layer is not particularly limited as long as it is an oxide that can exhibit adhesion to glass substrates. Examples include oxides containing metals such as titanium, silicon, tin, zirconium, zinc, nickel, indium, vanadium, chromium, manganese, iron, cobalt, and copper. One of these metals can be contained singly, or a combination of two or more of these metals can be contained.

Specific examples of the oxide that forms the oxide layer include $SnO_2$, $TiO_2$, $SiO_2$, and the like. Two or more of $SnO_2$, $TiO_2$, $SiO_2$, $SnO$, and the like may be mixed and used.

The oxide layer is formed by bringing a surface of a glass substrate into contact with and reacting with a reaction solution containing fluorine and an oxide precursor ion in the production method described later. Thus, the oxide layer contains fluorine. Since the fluorine adversely affects the electroless plating film, it is preferred that the fluorine content in the oxide layer is small. In step 2 of removing fluorine, which is described later, fluorine is removed by an annealing (hereinafter also referred to as "baking" in the present specification) treatment.

The fluorine content in the oxide layer is preferably 8 mass % or less, preferably 3 mass % or less, and more preferably 0.5 mass % or less, based on the oxide layer taken as 100 mass %. More specifically, when step 2 of removing fluorine such as an annealing treatment, which is described later in the production method for the plating film, is not performed, the fluorine content in the oxide layer is preferably 4 to 8 mass %; when an annealing treatment is performed at 150° C., the fluorine content in the oxide layer is preferably 1 mass % or less; and when an annealing treatment is performed at 550° C., the fluorine content in the oxide layer is preferably 0.1 mass % or less. The lower the lower limit of the amount of residual fluorine in the oxide layer, the better. The lower limit of the amount of residual fluorine in the oxide layer may be 0 mass %. However, it is difficult to reduce the residual fluorine to 0 mass % in the oxide layer formed by treatment in the reaction solution containing fluorine, as shown in the production method described later. Thus, the fluorine content may be below the detection limit of a detection device, and is preferably, for example, about 0.01 mass %.

Metal catalyst cores such as an Sn catalyst, an Ag catalyst, and a Pd catalyst may be attached to the oxide layer according to an ordinary method, and then an electroless plating film described later may be formed.

The thickness of the oxide layer is not particularly limited and is preferably 30 to 150 nm.

Electroless Plating Film

The plating film of the present invention comprises an electroless plating film on the oxide layer. Since the plating film of the present invention has the electroless plating film, good adhesion of the electrolytic copper plating film is achieved.

Since the plating film of the present invention has the oxide layer, the plating film of the present invention has excellent adhesion between the oxide layer and the electroless plating film. Thus, a known electroless plating film may be formed. Examples of such electroless plating films include electroless nickel-phosphorus (Ni—P) plating films, electroless copper plating films, electroless nickel-boron (Ni—B) plating films, and the like. Of these, electroless nickel-phosphorus plating films and electroless copper plating films are preferred in terms of further improving adhesion to the oxide layer.

The electroless nickel-phosphorus plating film has a phosphorus content of preferably 4 mass % or more, more preferably 6 mass % or more, and even more preferably 9 mass % or more, based on the electroless nickel-phosphorus plating film taken as 100 mass %. When the lower limit of the phosphorus content is within the above ranges, the adhesion between the oxide film and the electroless plating film is further improved. The upper limit of the phosphorus content is not particularly limited, and may be about 20 mass % or less. The phosphorus content of the electroless nickel-phosphorus plating film is the content as phosphorus element.

The content of phosphorus (phosphorus content) in the electroless nickel-phosphorus plating film in the vicinity of the interface with the oxide layer is preferably 9.3 mass % or more, more preferably 10.5 mass % or more, and even more preferably 11.5 mass % or more. The content of phosphorus in the electroless nickel-phosphorus plating film in the vicinity of the interface with the oxide layer is preferably higher, and the upper limit thereof is preferably 15.0 mass % or less, and more preferably 14.0 mass % or less. The electroless nickel-phosphorus plating film of the plating film of the present invention has a high phosphorus content in the vicinity of the interface with glass, which increases the affinity between the glass and the phosphorus in the electroless Ni—P plating film and improves plating adhesion.

In the present specification, "the vicinity of the interface with the oxide layer" in "the content of phosphorus in the electroless nickel-phosphorus plating film in the vicinity of the interface with the oxide layer" refers to the portion of the thickness that is preferably about 1% to 50%, and more preferably about 1% to 25% of the film thickness of the electroless nickel-phosphorus plating film, from the interface with the oxide layer.

For example, when the electroless nickel-phosphorus plating film has a film thickness of 2 μm, the portion of the thickness that is preferably about 1% to 50%, i.e., about 1 μm, and more preferably about 1% to 25%, i.e., about 0.5 μm, of the film thickness of the electroless nickel-phosphorus plating film from the oxide layer side is referred to as the vicinity of the interface with the oxide layer.

The electroless copper plating film has a moisture content of preferably 0.01 mass % or less, and more preferably 0.001 mass % or less, based on the electroless copper plating film taken as 100 mass %. When the moisture content is within the above ranges, the adhesion between the oxide film and the electroless plating film is further improved. The lower limit of the moisture content is not particularly limited and may be 0 mass %.

The moisture content of the electroless copper plating film can be reduced by annealing at a temperature of about 40 to 400° C. after the electroless copper plating film is formed.

The average crystal grain size of the electroless copper plating film is preferably 500 nm or less, more preferably 300 nm or less, even more preferably 200 nm or less, still even more preferably 100 nm or less, particularly preferably 90 nm or less, and most preferably 80 nm or less. When the upper limit of the average crystal grain size is within the above ranges, the adhesion between the oxide film and the electroless plating film is further improved. The lower limit of the average crystal grain size of the electroless copper plating film is not particularly limited and is about 10 nm.

Figure 2:
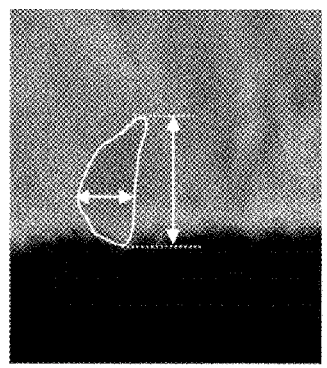
FIG. 2 shows a method for measuring the crystal grain size of an electroless plating film.

In the present specification, the average crystal grain size of the electroless plating film can be measured by the measurement method shown in FIGS. 1 and 2. FIG. 1 is an SEM image of an interface portion (up to 300 nm from the interface) between an oxide layer and an electroless plating film on a glass substrate. FIG. 2 is an enlarged view of crystal grains in FIG. 1. Specifically, as shown in FIG. 1, an SEM image of the interface portion (up to 300 nm from the interface) between the oxide layer and the electroless plating film on the glass substrate is taken; as shown in FIG. 2, the greatest diameter of a crystal grain in the vertical direction (the direction perpendicular to the interface portion in the SEM image) and the greatest diameter of the crystal grain in the transverse direction (the direction horizontal to the interface portion in the SEM image) are measured, and the crystal grain size is calculated based on the following formula.

Crystal grain size (nm)=(greatest diameter (nm) in vertical direction+greatest diameter (nm) in transverse direction)/2

The crystal grain size is measured at 15 points of the electroless plating film, and the average value is defined as the average crystal grain size.

The thickness of the electroless plating film is preferably 0.1 μm or more, more preferably 0.2 μm or more, even more preferably 0.3 μm or more, particularly preferably 0.5 μm or more, and most preferably 0.8 μm or more. The thickness of the electroless plating film is also preferably 3.0 μm or less, and more preferably 2.0 μm or less. When the thickness of the electroless plating film is within the above ranges, the stress is reduced, and the plating adhesion is further improved.

Electrolytic Copper Plating Film

The plating film of the present invention comprises an electrolytic copper plating film on the electroless plating film.

The electrolytic copper plating film is not particularly limited, and examples include known electrolytic copper plating films used for circuit boards.

The copper plating film is not particularly limited, and examples include copper sulfate plating films, copper pyrophosphate plating films, and the like. Of these, copper sulfate plating films are preferred in terms of more excellent plating adhesion.

The film thickness of the electrolytic copper plating film is preferably 0.5 μm or more, more preferably 0.7 μm or more, and even more preferably 1.0 μm or more. The upper limit of the film thickness of the electrolytic copper plating film is not particularly limited. When the electrolytic copper plating film of the plating film of the present invention has a film thickness within the above ranges, the plating adhesion is further improved.

2. Plated Article

The plated article of the present invention comprises an oxide layer, an electroless plating film, and an electrolytic copper plating film in this order on a glass substrate.

Glass Substrate

In the plated article of the present invention, the glass substrate is not particularly limited, and known glass substrates used as circuit boards for electronic devices can be used. The glass substrate is preferably, for example, a base material on which wiring is to be formed and that is a glass substrate for use in the production of electronic devices with increasing communication speeds.

The glass substrate is an amorphous substrate composed of a silica network and may contain a network former (network-forming oxide) of aluminum, boron, phosphorus, or the like and a network modifier (network-modifying oxide) of an alkali metal, an alkaline earth metal, magnesium, or the like.

Specific examples of the glass forming the glass substrate include soda glass, soda-lime glass, alkali-free glass, quartz glass, and the like. The glass is preferably, for example, a glass substrate made of glass such as aluminosilicate glass used as tempered glass.

The thickness of the glass substrate is not particularly limited and may be appropriately set according to the intended use. The thickness of the glass substrate is about 300 to 1000 μm.

Even when another substrate is used in place of the glass substrate, adhesion can be exhibited between the other substrate and the oxide layer. Examples of such other substrates include metal substrates, carbon substrates, resin substrates, resin films, ceramic substrates, silicon substrates, and the like. Among substrates, glass substrates are preferred because they are smooth, have excellent signal characteristics with low dielectric constant and low dielectric loss tangent, and good dimensional stability due to low coefficient of thermal expansion, and can be mass-produced at low cost. The plated article of the present invention is useful in that it can exhibit excellent adhesion between the glass substrate and the oxide layer.

Examples of the metals forming the metal substrates include aluminum, magnesium, iron, titanium, nickel, zinc, niobium, zirconium, molybdenum, brass, neodymium, stainless steel, Kovar, ferrite, and the like.

Examples of the resin substrates include fiber-reinforced plastic substrates (FRP, CFRP, GFRP), paper phenol substrates (FR-1, FR-2), paper epoxy substrates (FR-3), glass epoxy substrates (FR-4, FR-5), glass composite substrates (CEM-3), glass polyimide substrates (GPY), fluororesin substrates (PTFE, PFA, PVDF), PPO substrates (polyphenylene oxide), and the like.

Examples of the resins forming the resin films include PET (polyethylene terephthalate), polyimide, PEEK (polyetheretherketone), LCP (liquid crystal polymer), and the like.

Examples of the ceramic substrates include alumina substrates, alumina zirconia substrates, aluminum nitride substrates (AlN), silicon nitride substrates ($Si_3N_4$), and the like.

In the plated article of the present invention, the oxide layer, the electroless plating film, and the electrolytic copper plating film are the same as those described for the plating film above.

3. Method for Producing Plating Film

First Embodiment

The method for producing a plating film of the present invention is a method for producing a plating film to be formed on a glass substrate, comprising:
(1) step 1 of bringing a reaction solution containing fluorine and an oxide precursor into contact with a surface of a glass substrate to form an oxide layer on the glass substrate;
(2) step 2 of removing fluorine in the oxide layer;
(3) step 3 of adding catalysts to the oxide layer;
(4) step 4 of forming an electroless plating film on the oxide layer to which the catalysts have been added; and
(5) step 5 of forming an electrolytic copper plating film on the electroless plating film.

The above embodiment of the method for producing a plating film of the present invention is hereinafter also referred to as the "first embodiment."

Figure 3:
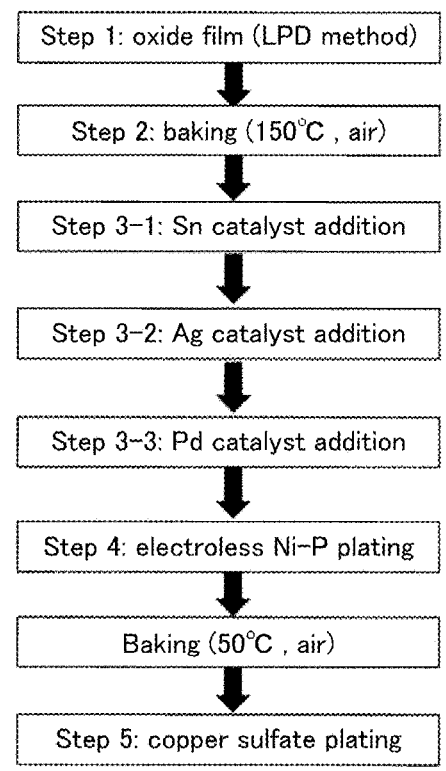
FIG. 3 is a flow diagram of an example of the production method of a first embodiment of the present invention.

The production method according to the first embodiment can be preferably applied when an electroless nickel-phosphorus plating film is formed in step 4 of forming an electroless plating film. FIG. 3 is a flow diagram of an example of the production method according to the first embodiment.

Each step of the production method according to the first embodiment is described below.

Step 1

Step 1 is a step of bringing a reaction solution containing fluorine and an oxide precursor into contact with a surface of a glass substrate to form an oxide layer on the glass substrate.

The method of bringing a reaction solution containing fluorine and an oxide precursor into contact with a surface of a glass substrate is not particularly limited. For example, a method such as immersing a glass substrate in a tank filled with a reaction solution containing fluorine and an oxide precursor, spraying, or application can be suitably used.

When the oxide layer is formed in a liquid phase as described above, the oxide layer can also be formed on the inner walls of through holes in the glass substrate, thus forming a dense continuous film. Here, the continuous film refers to a film in which no gap is formed between the film and the surface to be treated of the glass substrate, and the occurrence of portions on which the film is not formed (so-called "film loss") is suppressed over the entire surface to be treated.

When the oxide layer is formed in a liquid phase as described above, the oxide layer can also be formed uniformly on the inner walls of blind vias.

The reaction solution contains fluorine and an oxide precursor. As the oxide precursor, an aqueous solution containing an oxide precursor ion such as titanium, silicon, tin, zirconium, zinc, nickel, indium, vanadium, chromium, manganese, iron, cobalt, or copper can be used. These oxide precursor ions can be used singly or in a combination of two or more.

The oxide precursor ion may be present in the form of $M^{n+}$ (M: precursor element; n: valence of ion) and can be obtained by dissolving a fluoride or oxide of a precursor element in hydrofluoric acid.

A fluoride may be added separately to the reaction solution. Examples of fluorides include sodium fluoride, potassium fluoride, magnesium fluoride, calcium fluoride, ammonium fluoride, and the like.

The oxide precursor ion may be present in the form of a fluorocomplex (e.g., $MF_6^{2-}$, M: precursor element). The oxide precursor ion may also be present in the form of $H_2MF_6$ or its sodium salt, potassium salt, magnesium salt, calcium salt, ammonium salt, or the like.

Since the reaction solution contains fluorine, it may dissolve (etch) the surface of the glass substrate; thus, the pH may be controlled to suppress etching. The reaction solution preferably has a pH of 12 or less.

The temperature at which the glass substrate is brought into contact with the reaction solution is preferably higher, more preferably 20 to 80° C., and even more preferably 30 to 70° C. The reaction time may be appropriately adjusted according to the required film thickness of the oxide layer. There is a substantially linear relationship between the reaction time and the film thickness, and by adjusting the reaction time, a film thickness of several nanometers to several tens of micrometers can be obtained.

The composition of the reaction solution is, for example, a composition that contains 1 mmol/L or more of an oxide precursor and fluorine in an amount sufficient to completely dissolve it. The upper limit of the content of the oxide precursor is not particularly limited and is less than or equal to the solubility of the oxide precursor.

The molar ratio of the oxide precursor and fluorine in the reaction solution is not particularly limited as long as the amount of fluorine is sufficient to dissolve the oxide precursor. The amount of fluorine is preferably 2 moles or more per mole of the oxide precursor.

The oxide layer may contain boron or aluminum by containing an additive such as a boric acid salt, an aluminum salt, or hydrogen peroxide. When the reaction solution contains an additive such as a boric acid salt, an aluminum salt, or hydrogen peroxide, the film formation rate of the oxide layer can be further improved. The mechanism of the action is described below, using an example in which hexafluorotitanate ion ($TiF_6^{2-}$) is used as the oxide precursor.

When hexafluorotitanate ion ($TiF_6^{2-}$) is used, a film of $TiO_2$ can be formed on the surface of the glass substrate as an oxide layer by the reaction of the following equation (1).

$$TiF_6^{2-} + 2H_2O = TiO_2 + 6F^- + 4H^+ \qquad (1)$$

The reaction of equation (1) is a hydrolysis reaction of $TiF_6^{2-}$, which is accelerated by adding an additive such as a boric acid salt, an aluminum salt, or hydrogen peroxide.

For example, when boric acid is added, F⁻ on the right-hand side of equation (1) becomes $BF_4^-$ by the reaction of equation (2). As a result, the reaction of equation (1) proceeds to the right-hand side, and the formation of titanium oxide on the surface of the glass substrate can be accelerated. The reaction initiator is not limited to boric acid and may also be a salt such as sodium borate, ammonium borate, or potassium borate.

$$H_3BO_3 + 4H^+ + 4F^- = H^+ + BF_4^- + 3H_2O \quad (2)$$

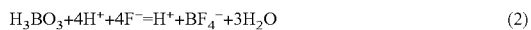

Similarly, when an aluminum ion source is added as a reaction initiator, the reaction of equation (1) proceeds to the right-hand side through the formation of $AlF_6^{3-}$ by the reaction of equation (3). As a result, the formation of titanium oxide on the surface of the glass substrate can be accelerated. As the aluminum ion source, an inorganic acid salt such as metallic aluminum, aluminum chloride, aluminum nitrate, or aluminum sulfate, or an organic acid salt such as aluminum citrate, aluminum lactate, or aluminum acetate can be suitably used.

$$Al^{3+} + 6F^- = AlF_6^{3-} \quad (3)$$

Hydrogen peroxide can also be suitably used as a reaction initiator, although it does not have the ability to form a complex with fluorine ions. Hydrogen peroxide has the property of hydrolyzing fluorotitanate ions. As a result, a titanium peroxo complex is formed. This titanium peroxo complex is a precursor of titanium oxide, and by bringing it into contact with the surface of the glass substrate in this state, titanium oxide can be deposited on the surface of the glass substrate to promote the formation of an oxide layer.

During the reaction, an oxide layer is formed on the surface of the glass substrate, and the oxide may be generated as particles in the reaction solution. In such a case, a step of withdrawing some of the reaction solution, filtering it through a filter, and returning it may be performed in order to remove the particles in the reaction solution. This step is referred to as a "filtering step."

By performing step 1 described above, an oxide layer is formed on the surface of the glass substrate.

Step 2

Step 2 is a step of removing fluorine in the oxide layer.

Fluorine remains in the oxide layer formed in step 1. This residual fluorine is difficult to remove or volatilize by washing with water or allowing the oxide layer to stand. When an electroless plating film is formed on the oxide layer to which catalysts have been added in step 4 described later, the residual fluorine is released from the oxide layer, for example, by chemical treatment during lamination or heat treatment after lamination and thus adversely affects the electroless plating film. Therefore, after the oxide layer is formed in step 1, step 2 is performed to remove fluorine.

In the plating film obtained by the production method of the present invention, the fluorine content in the oxide layer is preferably 0.01 mass % or more and 1.0 mass % or less. When the fluorine content in the oxide layer is within the above range, the adhesion of the catalysts added to the oxide layer in step 3 described later is further improved. The smaller the amount of residual fluorine in the oxide layer, the better. The amount of residual fluorine in the oxide layer may be 0 mass %. However, it is difficult to reduce the residual fluorine to 0 mass % in the oxide layer formed by treatment in the reaction solution containing fluorine. Thus, the fluorine content may be below the detection limit of a detection device, and is, for example, 0.01 mass %.

If the fluorine content in the oxide layer exceeds 1.0 mass %, fluorine may be released from the oxide layer at the time of laminating an electroless plating film or due to subsequent changes over time and may lift the electroless plating film, resulting in unevenness, micro-swelling, cracking, and peeling. In addition, the amount of catalysts to be added to and supported on the oxide layer for electroless plating in step 3 described later may decrease, which makes it difficult to form an electroless plating film.

The method of removing fluorine in the oxide layer is not limited as long as fluorine can be removed from the oxide layer. Specifically, the suitable method depends on the film thickness of the oxide layer and the type of metal used in the oxide layer. It is preferred that removing fluorine in step 2 is at least one step selected from the group consisting of a step of annealing the oxide layer and a step of bringing the oxide layer into contact with an alkaline solution. This is described in detail below.

When the oxide layer has a film thickness of 200 nm or more, it is preferable to remove fluoride in the oxide layer by a combination of an annealing treatment at 100 to 150° C. and an alkaline solution treatment with a solution having a pH of 10.5 or more, regardless of the type of metal.

When the film thickness is less than 200 nm, and an amphoteric oxide in which the type of metal is Sn (tin), Al (aluminum), Zn (zinc), Be (beryllium), Ga (gallium), Ge (germanium), Pb (lead), Sb (antimony), Bi (bismuth), Cd (cadmium), or the like is used in the oxide layer, it is preferable to remove fluoride in the oxide layer by a combination of an annealing treatment at 100 to 150° C. and an alkaline solution treatment with a solution having a pH of 10.5 or more or by an annealing treatment at 150° C. or more.

The atmosphere for the annealing treatment is not particularly limited, and examples includes air atmosphere, vacuum atmosphere, and inert gas atmosphere. Examples of inert gases include argon, helium, nitrogen, ammonia, and the like.

When the film thickness is less than 200 nm, and the type of metal in the oxide layer is not a metal that constitutes an amphoteric oxide, fluorine in the oxide layer can be removed by an annealing treatment at 150° C. or more or an alkaline solution treatment at a pH of 10.5 or more.

By performing step 2 described above, fluorine in the oxide layer is removed.

Step 3

Step 3 is a step of adding catalysts to the oxide layer.

In step 3, it is preferred that catalysts capable of forming an electroless plating film in step 4 described later are added and supported. Examples of catalyst solutions capable of adding such a catalyst include solutions containing metal ions such as gold, palladium, or silver. The glass substrate with the oxide layer formed thereon is brought into contact with such a catalyst solution, thereby adding a catalyst. For catalyst addition, a method such as immersing the glass substrate with the oxide layer in a tank filled with a catalyst solution, spraying, or application can be suitably used. The supported catalysts may be referred to as a "catalyst layer." That is, the catalyst layer may be a layer formed directly on the oxide layer.

The catalysts are supported on the oxide layer by surface adsorption and diffusion into the oxide layer. The catalysts are generally supported in the form of ions. They are reduced to metals by a reducing agent contained in the plating solution in the formation of an electroless plating film in step 4 described later, and acts as catalyst cores, thus forming a plating film.

When the catalysts are to be metallized in advance before step 4, the glass substrate with the oxide layer may be sensitized by exposing the substrate to a solution containing divalent tin ions ($Sn^{2+}$) to allow $Sn^{2+}$ to be supported before step 3, and then exposed to catalyst solutions. Alternatively, the glass substrate with the oxide layer may be exposed to catalyst solutions and then to a reducing agent before electroless plating, thereby metallizing the catalysts.

When a film of SnO is formed as the oxide layer, the layer contains abundant $Sn^{2+}$, which functions as a reducing agent; thus, catalysts can be supported in a metallic state in step 3.

Specifically, it is preferred that step 3 of adding catalysts preferably include
 (3-1) step 3-1 of adding a tin (Sn) catalyst to the surface of the oxide layer;
 (3-2) step 3-2 of adding a silver (Ag) catalyst after the Sn catalyst addition; and
 (3-3) step 3-3 of adding a palladium (Pd) catalyst after the Ag catalyst addition.

Step 3 may also include, after step 3-3,
 (3-4) step 3-4 of performing a heat treatment after the Pd catalyst addition; and
 (3-5) step 3-5 of performing a reduction treatment after the heat treatment.

These steps are described below. Step 3-4 and step 3-5 may be performed when an electroless copper plating film is formed as an electroless plating film in step 4 described later. Step 3-4 and step 3-5 do not have to be performed when an electroless nickel-phosphorus plating film or an electroless nickel-boron plating film is formed.

Table 1 shows an example of the process for forming plating films on the oxide layer.

TABLE 1

| Step | Main component | Temperature | Time |
|---|---|---|---|
| UV treatment<br>↓ | — | — | 30 minutes |
| Sn catalyst addition<br>↓ | Sn salt<br>Inorganic acid<br>Organic acid<br>Aromatic compound | 25° C. | 2 minutes |
| Ag catalyst addition<br>↓ | Ag salt<br>Inorganic acid | 25° C. | 1 minute |
| Pd catalyst addition<br>↓ | Pd salt<br>Inorganic acid | 25° C. | 1 minute |
| Electroless Ni—P plating pH = 6.5<br>↓ | Ni salt<br>Reducing agent<br>Complexing agent<br>Stabilizer<br>pH adjuster | 50° C. | 10 minutes |
| Annealing<br>↓ | | 50° C. | 1 hour |
| Electrolytic copper sulfate plating | Copper sulfate•5H$_2$O<br>98% sulfuric acid<br>Hydrochloric acid<br>Polymer<br>Leveler<br>Brightener | 25° C. | 50 minutes (1A/dm$^2$ 10 µm) |

Step 3-1

Step 3-1 is a step of adding a tin (Sn) catalyst to the surface of the oxide layer.

The oxide layer is preferably subjected to a pretreatment such as a degreasing treatment, a UV treatment, or a plasma treatment in advance.

In the step of adding an Sn catalyst to the surface of the oxide layer, a catalyst-adding solution containing an Sn catalyst is preferably used. Preferable examples of the Sn compound (Sn catalyst) contained in the Sn catalyst-adding solution include tin chloride, tin fluoroborate, tin oxide, tin sulfate, tin acetate, sodium stannate, and the like. When tin chloride, tin fluoroborate, or the like is preferably used as the Sn compound (Sn catalyst), a plating film is more sufficiently deposited, and the plating adhesion is improved.

Such Sn compounds can be used singly or in a combination of two or more.

The Sn catalyst-adding solution contains the Sn compound in a concentration of preferably 0.01 g/L or more, more preferably 0.05 g/L or more, and even more preferably 0.1 g/L or more, in terms of Sn. The Sn catalyst-adding solution contains the Sn compound in a concentration of preferably 10.0 g/L or less, more preferably 7.0 g/L or less, and even more preferably 5.0 g/L or less, in terms of Sn. By setting the lower limit of the Sn concentration within the above ranges, a sufficient amount of the Sn catalyst is adsorbed onto the surface of the oxide layer, and an electroless plating film is more sufficiently deposited. By setting the upper limit of the Sn concentration within the above ranges, an electroless plating film with high adhesion can be obtained without excessive adsorption of the Sn catalyst.

The step of adding an Sn catalyst to the surface of the oxide layer is preferably a method in which a catalyst-adding solution containing an Sn catalyst (Sn catalyst-adding solution) is brought into contact with the oxide layer. The step of adding an Sn catalyst is preferably a method comprising immersing the glass substrate with the oxide layer formed thereon in an Sn catalyst-adding solution, a method comprising spraying an Sn catalyst-adding solution on the surface of the oxide layer, or the like.

The catalyst-adding solution containing an Sn catalyst also preferably contains an inorganic acid, an organic acid, an aromatic compound, etc. Examples of inorganic acids include hydrochloric acid, nitric acid, sulfuric acid, phosphoric acid, boric acid, and the like. Examples of organic acids include formic acid, acetic acid, citric acid, oxalic acid, and the like. Examples of aromatic compounds include toluene, ethylbenzene, phenol, benzyl alcohol, catechol, xylene, phthalic acid, and the like.

The pH of the catalyst-adding solution containing an Sn catalyst is preferably within the range of 0.3 to 3.0, more preferably within the range of 0.5 to 2.5, and even more preferably within the range of 1.0 to 2.0. By setting the pH range of the catalyst-adding solution containing an Sn catalyst within the above ranges, a sufficient amount of the Pd catalyst is adsorbed onto the surface of the oxide layer, and an electroless plating film is more sufficiently deposited.

When the glass substrate with the oxide layer formed thereon is immersed in the Sn catalyst-adding solution, the liquid temperature of the Sn catalyst-adding solution is preferably 10° C. or more, more preferably 15° C. or more, and even more preferably 20° C. or more. The liquid temperature of the Sn catalyst-adding solution is preferably 50° C. or less, more preferably 40° C. or less, and even more preferably 30° C. or less. By setting the lower limit of the liquid temperature within the above ranges, a sufficient amount of the Sn catalyst is adsorbed onto the surface of the oxide layer, and an electroless plating film is more sufficient deposited. By setting the upper limit of the liquid temperature within the above ranges, an electroless plating film with high adhesion can be obtained without excessive adsorption of the Sn catalyst.

When the glass substrate with the oxide layer formed thereon is immersed in the Sn catalyst-adding solution, the treatment time for Sn catalyst addition is preferably several seconds or more, more preferably 30 seconds or more, and even more preferably 1 minute or more. The treatment time for Sn catalyst addition is preferably 20 minutes or less, more preferably 10 minutes or less, and even more preferably 5 minutes or less. By setting the lower limit of the treatment time for Sn catalyst addition within the above ranges, a sufficient amount of the Sn catalyst is adsorbed onto the surface of the glass, and an electroless plating film is more sufficiently deposited. By setting the upper limit of the treatment time for Sn catalyst addition within the above ranges, an electroless plating film with high adhesion can be obtained without excessive adsorption of the Sn catalyst.

By performing step 3-1 described above, a tin (Sn) catalyst is added to the surface of the oxide layer.

Step 3-2

Step 3-2 is a step of adding a silver (Ag) catalyst after the Sn catalyst addition.

In the step of adding an Ag catalyst to the oxide layer to which the Sn catalyst has been added, a catalyst-adding solution containing an Ag catalyst is preferably used. Preferable examples of the Ag compound (Ag catalyst) contained in the Ag catalyst-adding solution include silver nitrate, silver chloride, silver sulfide, silver phosphate, silver bromide, silver fluoride, silver iodide, silver oxide, and the like. When silver nitrate, silver chloride, silver sulfide, silver phosphate, or the like is preferably used as the Ag compound (Ag catalyst), a plating film is more sufficiently deposited, and the plating adhesion is improved.

Such Ag compounds can be used singly or in a combination of two or more.

The Ag catalyst-adding solution contains the Ag compound in a concentration of preferably 0.1 g/L or more, more preferably 0.2 g/L or more, and even more preferably 0.4 g/L or more, in terms of Ag. The Ag catalyst-adding solution contains the Ag compound in a concentration of preferably 3.0 g/L or less, more preferably 2.0 g/L or less, and even more preferably 1.6 g/L or less, in terms of Ag. By setting the lower limit of the Ag concentration within the above ranges, a sufficient amount of the Ag catalyst is adsorbed onto the surface of the oxide layer, and an electroless plating film is more sufficient deposited. By setting the upper limit of the Ag concentration within the above ranges, an electroless plating film with high adhesion can be obtained without excessive adsorption of the Ag catalyst.

The step of adding an Ag catalyst to the surface of the oxide layer to which the Sn catalyst has been added is preferably a method in which a catalyst-adding solution containing an Ag catalyst (Ag catalyst-adding solution) is brought into contact with the oxide layer to which the Sn catalyst has been added. The step of adding an Ag catalyst is preferably a method comprising immersing the glass substrate with the Sn-added oxide layer formed thereon in an Ag catalyst-adding solution, a method comprising spraying an Ag catalyst-adding solution on the surface of the oxide layer to which the Sn catalyst has been added, or the like.

The catalyst-adding solution containing an Ag catalyst also preferably contains an inorganic acid such as hydrochloric acid, nitric acid, sulfuric acid, phosphoric acid, or boric acid.

The pH of the catalyst-adding solution containing an Ag catalyst is preferably within the range of 3.0 to 6.5, more preferably within the range of 4.0 to 6.0, and even more preferably within the range of 5.0 to 5.5. By setting the pH range of the catalyst-adding solution containing an Ag catalyst within the above ranges, a sufficient amount of the Pd catalyst is adsorbed onto the surface of the oxide layer, and an electroless plating film is more sufficiently deposited.

When the glass substrate with the Sn-added oxide layer formed thereon is immersed in the Ag catalyst-adding solution, the liquid temperature of the Ag catalyst-adding solution is preferably 10° C. or more, more preferably 15° C. or more, and even more preferably 20° C. or more. The liquid temperature of the Ag catalyst-adding solution is preferably 50° C. or less, more preferably 40° C. or less, and even more preferably 30° C. or less. By setting the lower limit of the liquid temperature within the above ranges, a sufficient amount of the Ag catalyst is adsorbed onto the surface of the oxide layer, and an electroless plating film is more sufficient deposited. By setting the upper limit of the liquid temperature within the above ranges, an electroless plating film with high adhesion can be obtained without excessive adsorption of the Ag catalyst.

When the glass substrate with the Sn-added oxide layer formed thereon is immersed in the Ag catalyst-adding solution, the treatment time for Ag catalyst addition is preferably several seconds or more, more preferably 10 seconds or more, and even more preferably 30 seconds or more. The treatment time for Ag catalyst addition is preferably 10 minutes or less, more preferably 5 minutes or less, and even more preferably 2 minutes or less. By setting the lower limit of the treatment time for Ag catalyst addition within the above ranges, a sufficient amount of the Ag catalyst is adsorbed onto the surface of the oxide layer, and an electroless plating film is more sufficiently deposited. By setting the upper limit of the treatment time for Ag catalyst addition within the above ranges, an electroless plating film with high adhesion can be obtained without excessive adsorption of the Ag catalyst.

By performing step 3-2 described above, a silver (Ag) catalyst is added to the oxide layer after the Sn catalyst addition.

Step 3-3

Step 3-3 is a step of adding a palladium (Pd) catalyst after the Ag catalyst addition.

In the step of adding a Pd catalyst to the oxide layer to which the Ag catalyst has been added, a catalyst-adding solution containing a Pd catalyst is preferably used. Preferable examples of the Pd compound (Pd catalyst) contained in the Pd catalyst-adding solution include palladium chloride, palladium sulfate, palladium nitrate, palladium acetate, palladium oxide, palladium bromide, and the like. When palladium chloride, palladium sulfate, palladium nitrate, or the like is preferably used as the Pd compound (Pd catalyst), a plating film is more sufficiently deposited, and the plating adhesion is improved.

Such Pd compounds can be used singly or in a combination of two or more.

The Pd catalyst-adding solution contains the Pd compound in a concentration of preferably 0.05 g/L or more, more preferably 0.1 g/L or more, and even more preferably 0.15 g/L or more, in terms of Pd. The Pd catalyst-adding solution contains the Pd compound in a concentration of preferably 1 g/L or less, more preferably 0.7 g/L or less, and even more preferably 0.5 g/L or less, in terms of Pd. By setting the lower limit of the Pd concentration within the above ranges, a sufficient amount of the Pd catalyst is adsorbed onto the surface of the oxide layer, and an electroless plating film is more sufficiently deposited. By setting the upper limit of the Pd concentration within the above ranges, an electroless plating film with high adhesion can be obtained without excessive adsorption of the Pd catalyst.

The step of adding a Pd catalyst to the surface of the oxide layer to which the Ag catalyst has been added is preferably a method in which a catalyst-adding solution containing a Pd catalyst (Pd catalyst-adding solution) is brought into contact with the oxide layer to which the Ag catalyst has been added. The step of adding a Pd catalyst is preferably a method comprising immersing the glass substrate with the Ag-added oxide layer formed thereon in a Pd catalyst-adding solution, a method comprising spraying a Pd catalyst-adding solution on the surface of the oxide layer to which the Ag catalyst has been added, or the like.

The catalyst-adding solution containing a Pd catalyst also preferably contains an inorganic acid such as hydrochloric acid, nitric acid, sulfuric acid, phosphoric acid, or boric acid.

The pH of the catalyst-adding solution containing a Pd catalyst is preferably within the range of 0.3 to 3.0, more preferably within the range of 0.5 to 2.5, and even more preferably within the range of 1.0 to 2.0. By setting the pH range of the catalyst-adding solution containing a Pd catalyst within the above ranges, a sufficient amount of the Pd catalyst is adsorbed onto the surface of the oxide layer, and an electroless plating film is more sufficiently deposited.

When the glass substrate with the Ag-added oxide layer formed thereon is immersed in the Pd catalyst-adding solution, the liquid temperature of the Pd catalyst-adding solution is preferably 10° C. or more, more preferably 15° C. or more, and even more preferably 20° C. or more. The liquid temperature of the Pd catalyst-adding solution is preferably 50° C. or less, more preferably 40° C. or less, and even more preferably 30° C. or less. By setting the lower limit of the liquid temperature within the above ranges, a sufficient amount of the Pd catalyst is adsorbed onto the surface of the oxide layer, and an electroless plating film is more sufficient deposited. By setting the upper limit of the liquid temperature within the above ranges, an electroless plating film with high adhesion can be obtained without excessive adsorption of the Pd catalyst.

When the glass substrate with the Ag-added oxide layer formed thereon is immersed in the Pd catalyst-adding solution, the treatment time for Pd catalyst addition is preferably several seconds or more, more preferably 10 seconds or more, and even more preferably 30 seconds or more. The treatment time for Pd catalyst addition is preferably 10 minutes or less, more preferably 5 minutes or less, and even more preferably 2 minutes or less. By setting the lower limit of the treatment time for Pd catalyst addition within the above ranges, a sufficient amount of the Pd catalyst is adsorbed onto the surface of the oxide layer, and an electroless plating film is more sufficiently deposited. By setting the upper limit of the treatment time for Pd catalyst addition within the above ranges, an electroless plating film with high adhesion can be obtained without excessive adsorption of the Pd catalyst.

By performing step 3-3 described above, a palladium (Pd) catalyst is added after the Ag catalyst addition.

Step 3 of adding catalysts may include step 3-1 and step 3-3, and step 3-2 may not be performed. When step 3-1 and step 3-3 are performed without performing step 3-2, step 3-1 and step 3-3 may be repeated multiple times (e.g., about 2 to 5 times).

Additives of Catalyst-Adding Solution

The catalyst-adding (e.g., Sn catalyst-adding, Ag catalyst-adding, and Pd catalyst-adding) solutions preferably further contains various additives, as necessary. Examples of preferable additives include stabilizers, pH buffers, surfactants, and the like.

Preferable examples of stabilizers include lead salts such as lead nitrate and lead acetate; bismuth salts such as bismuth nitrate and bismuth acetate; sulfur compounds such as sodium thiosulfate; and the like. Such stabilizers can be used singly or in a combination of two or more. When a stabilizer is added, the amount of the stabilizer added is preferably, for example, about 0.01 to 100 mg/L.

Preferable examples of pH buffers include acetic acid, boric acid, phosphoric acid, phosphorous acid, and carbonic acid; sodium salts, potassium salts, and ammonium salts of these acids; and the like. Such pH buffers can be used singly or in a combination of two or more. When a pH buffer is added, the amount of the pH buffer added is preferably about 0.002 to 1 mol/L, in terms of bath stability etc.

Examples of surfactants that can be preferably used include various surfactants, such as nonionic, anionic, cationic, and amphoteric surfactants. Preferable examples of such surfactants include alkali salts of aromatic or aliphatic sulfonic acid, alkali metal salts of aromatic or aliphatic carboxylic acid, and the like. Such surfactants can be used singly or in a combination of two or more. When a surfactant is added, the amount of the surfactant added is preferably, for example, about 0.01 to 1,000 mg/L.

Step 3-4

Step 3-4 is a step of performing a heat treatment after the Pd catalyst addition. The heat treatment allows the catalysts to diffuse well on the oxide layer and further improves the adhesion. Step 3-4 may be performed when an electroless copper plating film is formed as an electroless plating film in step 4 described later. Step 3-4 does not have to be performed when an electroless nickel-phosphorus plating film or an electroless nickel-boron plating film is formed.

The step of heat-treating the glass substrate to which the Pd catalyst has been added is not particularly limited, and the glass substrate to which the Pd catalyst has been added can be heat-treated by a known method. The heat treatment step is preferably performed, for example, by heating in a furnace the glass substrate with the Pd-added oxide layer formed thereon.

The atmosphere for heat treatment is not particularly limited, and examples include air atmosphere, vacuum atmosphere, and inert gas atmosphere. Examples of inert gases include argon, helium, nitrogen, ammonia, and the like.

When the glass substrate with the Pd-added oxide layer formed thereon is heat-treated, the heat treatment temperature is preferably 150° C. or more, more preferably 300° C. or more, even more preferably 400° C. or more, particularly preferably 450° C. or more, and most preferably 500° C. or more. The heat treatment temperature is preferably 800° C. or less, more preferably 750° C. or less, and even more preferably 700° C. or less. By preferably setting the heat treatment temperature to 150° C. or more and 800° C. or less, the metal catalysts are firmly adsorbed on the oxide layer, and an electroless plating film with high adhesion strength can be obtained through the metal catalysts.

When the glass substrate with the Pd-added oxide layer formed thereon is heat-treated, the heat treatment time is preferably 1 minute or more, more preferably 2 minutes or more, and even more preferably 5 minutes or more. The heat treatment time is preferably 60 minutes or less, more preferably 30 minutes or less, and even more preferably 20 minutes or less. By preferably setting the heat treatment time to 1 minute or more and 60 minutes or less, the metal catalysts are firmly adsorbed on the oxide layer in a short period of time, and an electroless plating film with high adhesion can be obtained through the metal catalysts.

By performing step 3-4 described above, a heat treatment is performed after the Pd catalyst addition.

Step 3-5

Step 3-5 is a step of performing a reduction treatment after the heat treatment. The reduction treatment allows the catalysts to diffuse well on the oxide layer and further improves the adhesion. Step 3-5 may be performed when an electroless copper plating film is formed as an electroless plating film in step 4 described later. Step 3-5 does not have to be performed when an electroless nickel-phosphorus plating film or an electroless nickel-boron plating film is formed.

There is no particular limitation on the method for performing a reduction treatment on the glass substrate with the heat-treated oxide layer formed thereon. The glass substrate can be subjected to a reduction treatment by a known method.

The step of performing a reduction treatment can be preferably performed, for example, by a method of performing a reduction treatment using a reduction treatment solution containing a reducing agent and at least one alkali selected from the group consisting of alkali metal hydroxides and alkaline earth metal hydroxides.

The alkali is not particularly limited as long as it is preferably at least one member selected from the group consisting of alkali metal hydroxides and alkaline earth metal hydroxides.

Examples of alkali metal hydroxides include, but are not limited to, lithium hydroxide, sodium hydroxide, potassium hydroxide, rubidium hydroxide, cesium hydroxide, and the like.

Examples of alkaline earth metal hydroxides include, but are not limited to, magnesium hydroxide, calcium hydroxide, strontium hydroxide, barium hydroxide, and the like.

Preferable examples of alkalis include sodium hydroxide, potassium hydroxide, calcium hydroxide, barium hydroxide, and the like, and more preferably sodium hydroxide, potassium hydroxide, and the like.

The concentration of the alkali in the reduction treatment solution is preferably 0.3 to 100 g/L, more preferably 0.5 to 10 g/L, and even more preferably 1 to 5 g/L. By setting the alkali concentration within the above ranges, the metal catalysts can be efficiently reduced and an electroless Ni—P plating film with high adhesion can be obtained.

Step 3-5 is preferably a method in which a reduction treatment solution containing a reducing agent is brought into contact with the glass substrate with the heat-treated oxide layer formed thereon. The step of performing a reduction treatment is more preferably, a method comprising immersing the glass substrate with the heat-treated oxide layer formed thereon in the reduction treatment solution; a method comprising spraying the reduction treatment solution on the surface of the heat-treated oxide layer; or the like.

The reducing agent is not particularly limited as long as it is preferably a reducing agent capable of depositing a metal of a metal catalyst (core), such as an Sn catalyst, an Ag catalyst, or a Pd catalyst. Reducing agents that can be used in reduction plating can be used.

Preferable examples of the reducing agent include amine compounds such as dimethylamine borane, diethylamine borane, trimethylamine borane, and hydrazine; boron-containing compounds such as sodium borohydride; and phosphorus-containing compounds such as hypophosphorous acid, salts of hypophosphorous acid (e.g., sodium hypophosphite, potassium hypophosphite, and ammonium hypophosphite), and hydrates thereof; and the like.

The reducing agent may be, for example, a reducing agent that is both an amine compound and a boron-containing compound. In this case, when the reduction treatment solution contains such a reducing agent, the reduction treatment solution is considered to contain both an amine compound and a boron-containing compound.

Preferable examples of the amine compound include amine borane, hydrazine, hydrazine derivatives, and the like.

Amine borane is an amine borane complex, which is a complex of borane (e.g. $BH_3$) and an amine. The amine that constitutes the amine borane may be either a chain amine (acyclic amine) or a cyclic amine, and is preferably a chain amine. Preferable examples of amines that constitutes a borane complex include dimethylamine, diethylamine, trimethylamine, triethylamine, methoxyethylamine, dicyclohexylamine, t-butylamine, aminopyridine, ethylenediamine, morpholine, pyridine, piperidine, imidazole, and the like. Of these, dimethylamine, diethylamine, trimethylamine, methoxyethylamine, dicyclohexylamine, and the like are preferred; and dimethylamine and the like are more preferred.

Specific examples of preferable amine borane include dimethylamine borane (DMAB), diethylamine borane, trimethylamine borane, and the like. By preferably using amine borane, more preferably dimethylamine borane (DMAB), trimethylamine borane, or the like as a reducing agent, the metal catalysts can be efficiently reduced and an electroless plating film with high adhesion can be obtained.

The hydrazine derivative is not particularly limited as long as it can be used as a reducing agent for electroless plating.

Preferable examples of the boron-containing compound include borohydride compounds. Specific examples include the amine borane described above, which is also an amine compound, borane complexes other than the amine borane (complexes of borane and another compound), alkali metal salts of borohydride (e.g. sodium borohydride), and the like.

Preferable examples of phosphorus-containing compounds include hypophosphorous acid, salts of hypophosphorous acid (e.g., sodium hypophosphite, potassium hypophosphite, and ammonium hypophosphite), phosphorous acid, salts of phosphorous acid (e.g., sodium phosphite, potassium phosphite, and ammonium phosphite), hydrates thereof, and the like.

The reducing agent preferably contains an amine compound. The amine compound preferably contains at least one member selected from the group consisting of amine borane, hydrazine, and hydrazine derivatives; more preferably contains at least one member selected from the group consisting of amine borane and hydrazine; and even more preferably contains amine borane (DMAB etc.).

Such reducing agents can be used singly, or in a combination of two or more.

The concentration of the reducing agent in the reduction treatment solution containing a reducing agent is preferably 0.3 g/L or more, more preferably 0.4 g/L or more, and even more preferably 0.5 g/L or more. The concentration of the reducing agent in the reduction treatment solution is preferably 20 g/L or less, more preferably 10 g/L or less, and even more preferably 5 g/L or less. When the reduction treatment solution contains a reducing agent in a concentration of preferably 0.3 g/L or more and 20 g/L or less, the metal catalysts can be efficiently reduced and an electroless plating film with high adhesion can be obtained.

When the heat-treated oxide layer is reduced, the temperature of the reduction treatment is preferably 25° C. or more, more preferably 40° C. or more, and even more preferably 50° C. or more. The temperature of the reduction treatment is preferably 80° C. or less, more preferably 75° C. or less, and even more preferably 70° C. or less. By preferably setting the reduction treatment temperature to 25° C. or more and 80° C. or less, the metal catalysts can be efficiently reduced and an electroless plating film with high adhesion can be obtained.

When the heat-treated oxide layer is reduced, the reduction treatment time is 30 seconds or more, preferably 1 minute or more, and more preferably 3 minutes or more. The reduction treatment time is preferably 15 minutes or less, more preferably 10 minutes or less, and even more preferably 5 minutes or less. When the reduction treatment time is preferably set to 30 seconds or more and 15 minutes or less, the metal catalysts can be efficiently reduced and an electroless plating film with high adhesion can be obtained.

By performing step 3 described above, catalysts are added to the oxide layer.

Step 4

Step 4 is a step of forming an electroless plating film on the oxide layer to which the catalysts have been added.

Since the plating film of the present invention has the oxide layer, the plating film of the present invention has excellent adhesion to an electroless plating film. Thus, a known electroless plating film may be formed. Examples of such electroless plating films include electroless nickel-phosphorus plating films, electroless copper plating films, electroless nickel-boron plating films, and the like. Of these, electroless nickel-phosphorus plating films and electroless copper plating films are preferred in terms of further improving adhesion to the oxide layer. In particular, the production method according to the first embodiment is suitable for forming an electroless nickel-phosphorus plating film in step 4.

The electroless nickel-phosphorus plating film has a phosphorus content of preferably 4 mass % or more, more preferably 6 mass % or more, and even more preferably 9 mass % or more, based on the electroless nickel-phosphorus plating film taken as 100 mass %. Since the lower limit of the phosphorus content is within the above ranges, the adhesion between the oxide film and the electroless plating film is further improved. The upper limit of the phosphorus content is not particularly limited, and may be about 20 mass % or less.

The phosphorus content of the electroless nickel-phosphorus plating film in the vicinity of the interface with the oxide layer is the content as phosphorus element and is preferably 9.3 mass % or more.

The method of forming the electroless nickel-phosphorus plating film is described below.

The method of forming the electroless nickel-phosphorus (Ni—P) plating film is not particularly limited. The electroless Ni—P plating film can be formed by a known method. The step of forming the electroless Ni—P plating film is preferably, for example, a method of forming a plating film using an electroless Ni—P plating bath. Each component in the electroless Ni—P plating bath is described below.

Water-Soluble Nickel Compound

When a plating film is formed using an electroless Ni—P plating bath, the electroless Ni—P plating bath preferably contains a water-soluble nickel compound.

The water-soluble nickel compound is not particularly limited, and known nickel compounds used in electroless Ni—P plating baths can be used. Preferable examples of water-soluble nickel compounds include water-soluble nickel inorganic salts such as nickel sulfate, nickel chloride, nickel hypophosphite, and nickel carbonate; water-soluble nickel organic salts such as nickel acetate and nickel malate; and hydrates thereof; and the like.

Such water-soluble nickel compounds can be used singly or in a combination of two or more.

The concentration of the water-soluble nickel compound in the electroless Ni—P plating bath is not particularly limited as long as it is a concentration that allows an electroless Ni—P plating film to be produced. The concentration can be appropriately adjusted. The concentration of the water-soluble nickel compound is preferably, for example, about 0.01 to 100 g/L, more preferably 0.5 to 50 g/L, and even more preferably 1 to 10 g/L, in terms of nickel metal. A water-soluble nickel compound concentration of less than 0.01 g/L in terms of nickel metal may decrease the deposition rate, whereas a water-soluble nickel compound concentration of more than 100 g/L may decrease the bath stability. Thus, the concentration of the water-soluble nickel compound is preferably within the above ranges.

Reducing Agent

The reducing agent is preferably at least one member selected from the group consisting of hypophosphorous acid and salts of hypophosphorous acid (e.g., sodium hypophosphite, potassium hypophosphite, and ammonium hypophosphite).

Such reducing agents can be used singly or in a combination of two or more.

The concentration of the reducing agent (e.g., hypophosphorous acid, a hypophosphorous acid salt, and a hydrate thereof) in the electroless Ni—P plating bath is preferably about 35 to 80 g/L, and more preferably about 48 to 60 g/L. A reducing agent concentration of less than 35 g/L and a reducing agent concentration of more than 80 g/L may decrease the adhesion of electroless Ni—P plating. Thus, the concentration of the reducing agent is preferably within the above ranges.

Complexing Agent

The electroless Ni—P plating bath preferably contains a complexing agent such as glycine or a salt of gluconic acid. The salt of gluconic acid is preferably, for example, sodium gluconate, potassium gluconate, ammonium gluconate, or the like.

Preferable examples of other complexing agents include monocarboxylic aids such as formic acid and acetic acid and salts thereof (e.g., sodium salts, potassium salts, and ammonium salts); dicarboxylic acids such as malonic acid, succinic acid, adipic acid, maleic acid, and fumaric acid and salts thereof (e.g., sodium salts, potassium salts, and ammonium salts); hydroxycarboxylic acids such as malic acid, lactic acid, glycolic acid, and citric acid and salts thereof (e.g., sodium salts, potassium salts, and ammonium salts); ethylenediamine diacetic acid, ethylenediamine tetraacetic acid, and salts thereof (e.g., sodium salts, potassium salts, and ammonium salts); amino acids such as alanine and arginine; and the like.

Such complexing agents can be used singly or in a combination of two or more.

The concentration of the complexing agent in the electroless Ni—P plating bath is not particularly limited and can be appropriately adjusted. The electroless Ni—P plating bath preferably contains the complexing agent in an amount of about 1 to 100 g/L, more preferably about 2 to 50 g/L, and even more preferably about 5 to 30 g/L. A complexing agent concentration of of less than 1 g/L may decrease the bath stability, whereas a complexing agent concentration of more than 100 g/L may decrease the deposition rate. Thus, the concentration of the complexing agent is preferably within the above ranges.

Stabilizers, pH Adjusters, Surfactants, Etc.

The electroless Ni—P plating bath can optionally further contain, in addition to the above components, known additives for use in electroless Ni—P plating baths, if necessary. Examples of additives include stabilizers, pH adjusters, surfactants, and the like.

Examples of stabilizers include lead compounds (e.g., lead nitrate and lead acetate), cadmium compounds (e.g., cadmium nitrate and cadmium acetate), thallium compounds (e.g., thallium sulfate and thallium nitrate), antimony compounds (e.g., antimony chloride and potassium antimonyl tartrate), tellurium compounds (e.g., telluric acid and tellurium chloride), chromium compounds (e.g., chromium oxide and chromium chloride), iron compounds (e.g., iron sulfate and iron chloride), manganese compounds (e.g., manganese sulfate and manganese nitrate), bismuth compounds (e.g., bismuth nitrate and bismuth acetate), tin compounds (e.g., tin sulfate and tin chloride) selenium compounds (e.g., selenic acid and selenite), cyanides (e.g., methylcyanide and isopropylcyanide), allyl compounds (e.g., allylamine and diarylamine), and the like.

Such stabilizers can be used singly or in a combination of two or more.

The concentration of the stabilizer in the electroless Ni—P plating bath is not particularly limited and can be, for example, in the range of about 0.1 to 500 mg/L. In order to improve the stability of the electroless Ni—P plating bath, the concentration of the stabilizer is preferably about 0.1 mg/L or more. If the concentration of the stabilizer exceeds 500 mg/L, an area where no plating film is formed (an undeposited portion) may occur. Therefore, the concentration is preferably within the range described above.

The pH adjuster is preferably, for example, an acid such as hydrochloric acid, sulfuric acid, or phosphoric acid; or an alkali such as sodium hydroxide, potassium hydroxide, or aqueous ammonia.

The pH of the electroless Ni—P plating bath is preferably a pH of about 3 to 12, more preferably a pH of about 4 to 9. The pH of the plating bath can be adjusted by using the pH adjuster described above. A pH of less than 3 may result in undeposition and a pH of more than 12 may result in decreased bath stability. Therefore, the pH is preferably within the range described above.

Examples of usable surfactants include various surfactants such as nonionic, anionic, cationic, and amphoteric surfactants. Specific examples include alkali salts of aromatic or aliphatic sulfonic acid, alkali metal salts of aromatic or aliphatic sulfonic acid, and the like. The surfactants can be used singly or as a mixture of two or more. When two or more surfactants are mixed and used together, the mixing ratio is not particularly limited and can be appropriately determined.

The concentration of the surfactant in the electroless Ni—P plating bath is not particularly limited and can be, for example, in the range of about 0.01 to 1000 mg/L. In order to further improve the pit-preventing effect of the electroless Ni—P plating bath, the concentration of the surfactant is preferably about 0.01 mg/L or more. A surfactant concentration of 1000 mg/L or less further suppresses the reduction in deposition due to foaming.

Electroless Plating Method

Step 4 of forming an electroless plating film (electroless plating method) is preferably a step in which a glass substrate with a catalyst-added oxide layer formed thereon (an object to be plated) is brought into contact with an electroless plating bath.

The object to be plated is a glass substrate having an Sn-, Ag-, Pd-, or like catalyst-added oxide layer formed on the surface thereof, and preferably a glass substrate having formed thereon an oxide layer subjected to a heat treatment, a reduction treatment, or like treatment after addition of a Pd catalyst.

The method for bringing the object to be plated into contact with the electroless plating bath is not particularly limited and can be performed according to a usual method. Step 4 is preferably performed, for example, by immersing the object to be plated in an electroless plating bath.

The plating treatment conditions (e.g., bath temperature, plating treatment time, etc.) are not particularly limited as long as they are conditions under which an electroless plating film can be formed. The plating treatment conditions can be suitably determined.

The bath temperature of the electroless plating bath in the plating step can be appropriately determined according to, for example, the composition of the plating bath. For example, the bath temperature of the electroless nickel-phosphorus plating bath in the plating step can preferably be set to about 25° C. or more, more preferably about 40 to 100° C., and even more preferably about 45 to 95° C. If the bath temperature is less than 25° C., the deposition rate of the plating film is slow and may result in decreased production efficiency. Therefore, the bath temperature is preferably within the range described above.

The treatment time in the plating step is not particularly limited and can be set to the time taken for an electroless plating film of the required thickness to form on the object to be plated. Specifically, the treatment time in the plating step can be appropriately determined according to, for example, the plating bath composition and the type of object to be plated. For example, the treatment time is preferably about 1 to 40 minutes, and more preferably 3 to 20 minutes.

By performing step 4 described above, an electroless plating film is formed on a catalyst-added oxide layer described above.

Heat Treatment Step 1

The production method of the present invention may comprise a heat treatment (annealing) step 1 between step 4 and step 5. By including a heat treatment (annealing) step 1 between step 4 and step 5 in the production method of the present invention, the adhesion of the electroless plating film is further improved.

The heat treatment method of heat treatment step 1 described above is not particularly limited as long as it is a heat treatment method normally used in the formation of plating films. Examples include a method of placing the glass substrate in a thermostatic bath; a method of placing the glass substrate in a heating furnace or an electric furnace; and the like. The atmosphere of the heat treatment is not particularly limited and includes air atmosphere, vacuum atmosphere, inert gas atmosphere, and the like. Examples of the inert gas include argon, helium, nitrogen, ammonia, and the like.

The heat treatment temperature in heat treatment step 1 described above is not particularly limited as long as it is a heating temperature normally used in the formation of plating films. The heat treatment temperature is preferably 40 to 400° C., and more preferably 50 to 300° C.

The heat treatment time in heat treatment step 1 is not particularly limited as long as it is a heating time normally used in the formation of plating films. The heat treatment time may be in the range of about 30 minutes to about 3 hours.

Step 5

Step 5 is a step of forming an electrolytic copper plating film on the electroless plating film.

The method of forming an electrolytic copper plating film is not particularly limited, and the electrolytic copper plating film can be formed by a known method. The step of forming an electrolytic copper plating film is preferably, for example, a method of forming a plating film using an electrolytic copper plating bath.

Electrolytic Copper Plating Bath

The type of bath for electrolytic copper plating is not particularly limited and any plating solution can be used. Copper sulfate plating and copper pyrophosphate plating are particularly preferable. Examples of the copper ion source of copper plating include, but are not limited to, copper(II) sulfate, copper(II) pyrophosphate, copper (I) cyanide, copper(II) acetate, and the like, with copper(II) sulfate and copper(II) pyrophosphate being preferred.

Such copper ion sources may be used singly or in a combination of two or more.

The concentration of the water-soluble copper compound in the electrolytic copper plating bath is, for example, preferably about 1 to 60 g/L, and more preferably about 10 to 40 g/L, in terms of copper ion concentration.

The pH range of the electrolytic copper plating bath is preferably a weakly alkaline to strongly acidic range.

Preferable examples of usable pH adjusters include various acids such as hydrochloric acid, sulfuric acid, phosphoric acid, and polyphosphoric acid, and various bases such as ammonium hydroxide, sodium hydroxide, and potassium hydroxide. Such pH adjusters may be used singly or in a combination of two or more.

To reduce fluctuations in pH of the electrolytic copper plating bath, a pH buffer is preferably added. The pH buffer can be a known pH buffer. Preferable examples of pH buffers include sodium acetate, potassium acetate, sodium borate, potassium borate, ammonium borate, sodium formate, potassium formate, sodium tartrate, potassium tartrate, sodium dihydrogen phosphate, potassium dihydrogen phosphate, ammonium dihydrogen phosphate, sodium pyrophosphate, potassium pyrophosphate, and the like. Such pH buffers can be used singly or in a combination of two or more.

Additives such as complexing agents, polymer compounds, surfactants, levelers, stress reducers, conductivity aids, defoamers, and brighteners are preferably added to the electrolytic copper plating bath, as necessary.

Electrolytic Copper Plating Method

The method for preparing the copper plating bath is not particularly limited. The bath preparation method for the copper plating bath preferably comprises dissolving a water-soluble copper compound in an aqueous solution containing an acid, such as sulfuric acid, dissolved therein; then adding thereto an additive, such as a complexing agent and a reducing agent; and finally adjusting the pH to a predetermined pH to prepare an electrolytic copper plating solution.

When electrolytic copper plating is performed, the plating temperature is preferably about 10 to 60° C., more preferably about 20 to 50° C., and even more preferably about 25 to 40° C. Preferably, the plating solution is agitated and the object to be plated is rocked, as necessary.

A plating temperature of about 10° C. or more in electrolytic copper plating can form a more uniform copper plated film. A plating temperature of about 60° C. or less in electrolytic copper plating can improve adhesion and appearance of the obtained copper plated film.

The current density in electrolytic copper plating is preferably about 0.1 to 20 A/cm$^2$, more preferably about 0.5 to 10 A/dm$^2$, and even more preferably about 1 to 5 A/dm$^2$.

A current density of about 0.1 A/dm$^2$ or more in electrolytic copper plating is economically advantageous because a high copper plating speed is achieved and it takes less time to obtain the desired film thickness. A current density of about 20 A/dm$^2$ or less in electrolytic copper plating can provide good deposition efficiency and is economically advantageous.

Rust Prevention Treatment Step

The production method according to the first embodiment may comprise a rust prevention treatment step after step 5. When the production method according to the first embodiment comprises a rust prevention treatment step after step 5, the formation of copper oxide on the surface of the electrolytic copper plating film can be suppressed. In particular, when heating is performed in air in the heat treatment step described later, the formation of such copper oxide can be suppressed.

The rust prevention treatment method is not particularly limited as long as it is a rust prevention treatment method normally used in the formation of plating films. Examples include a method of immersion in a rust prevention treatment solution containing, for example, a phosphate, such as polyphosphate, phosphonate, or orthophosphate; silicate; metasilicate; chromate; benzotriazole; tolyltriazole; mercatobenzothiazole; or the like.

Heat Treatment Step 2 The production method of the present invention may have a heat treatment (annealing) step 2 after step 5. When the production method of the present invention comprises a heat treatment step 2 after step 5, the adhesion of the electrolytic copper plating film is further improved.

The heat treatment method of the heat treatment step is not particularly limited as long as it is a heat treatment method normally used in the formation of plating films. Examples include a method of placing the glass substrate in a thermostatic bath; a method of placing the glass substrate in a heating furnace or an electric furnace; and the like. The atmosphere for heat treatment is not particularly limited and includes air atmosphere, vacuum atmosphere, and inert gas atmosphere. Examples of inert gases include argon, helium, nitrogen, ammonia, and the like.

The heat treatment temperature in heat treatment step 2 is not particularly limited as long as it is a heating temperature normally used in the formation of plating films, and may be in the range of about 40 to 500° C.

The heat treatment time in heat treatment step 2 described above is not particularly limited as long as it is substantially the same as a heating time normally used in the formation of plating films, and may be about 30 minutes to about 3 hours.

Second Embodiment

The method for producing a plating film of the present invention is also a method for producing a plating film to be formed on a glass substrate, comprising (I) step I of bringing a reaction solution containing fluorine and an oxide precursor into contact with a surface of a glass substrate to form an oxide layer on the glass substrate, (II) step II of adding a catalyst to the oxide layer;
(III) step III of removing fluorine in the oxide layer to which the catalyst has been added;
(IV) step IV of forming an electroless plating film on the oxide layer to which the catalyst has been added; and
(V) step V of forming an electrolytic copper plating film on the electroless plating film.

This embodiment of the method for producing the plating film of the present invention is hereinafter also referred to as the "second embodiment."

Figure 4:
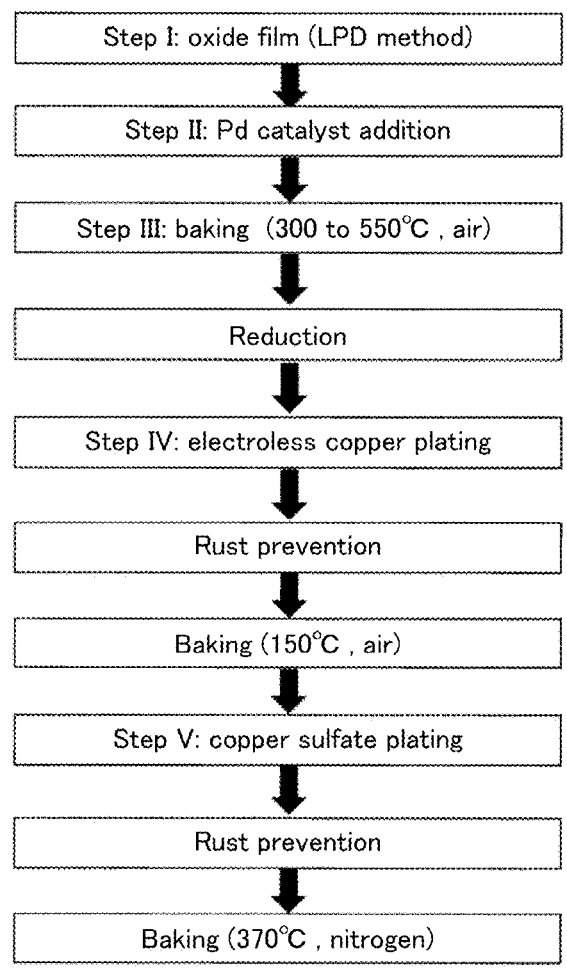
FIG. 4 is a flow diagram of an example of the production method of a second embodiment of the present invention.

The production method according to the second embodiment can be preferably applied when an electroless copper plating film is formed in step IV of forming an electroless plating film. FIG. 4 is a flow diagram illustrating an example of the production method according to the second embodiment.

Each step of the production method according to the second embodiment is described below.

Step (I)

Step I is a step of bringing a reaction solution containing fluorine and an oxide precursor into contact with a surface of a glass substrate to form an oxide layer on the glass substrate.

Step I in the production method according to the second embodiment is the same as step 1 described in the production method according to the first embodiment. An oxide layer is formed on a glass substrate by bringing a reaction solution containing fluorine and an oxide precursor into contact with a surface of the glass substrate under the same conditions as in step 1 in the production method according to the first embodiment.

Step II

Step II is a step of adding a catalyst to the oxide layer.

Step II in the production method according to the second embodiment is almost identical to step 3 described in the production method described in the production method according to the first embodiment. However, when an electroless copper plating film is formed in step IV in the production method according to the second embodiment as shown in FIG. 4, a Pd catalyst is preferably added onto the oxide layer without adding an Sn catalyst to the oxide layer and subsequently adding an Ag catalyst before adding a Pd catalyst. That is, when an electroless copper plating film is formed in step IV as in the production method according to the second embodiment shown in FIG. 4, it is unnecessary to go through step 3-1 and step 3-2 of the first embodiment, and a Pd catalyst can be directly added to the oxide layer. Step II according to the second embodiment is described below.

In step II, it is preferred that a catalyst capable of forming an electroless plating film in step IV described later is added and supported. Examples of catalyst solutions capable of adding such a catalyst include solutions containing ions of a metal, such as gold, palladium, or silver. When electroless copper plating is formed in step IV as in the production method according to the second embodiment shown in FIG. 4, a palladium catalyst is preferably used. The glass substrate with an oxide layer formed thereon is brought into contact with a solution containing such meal ions, thereby adding a catalyst. For catalyst addition, a method such as immersing a glass substrate with the oxide layer formed thereon in a tank filled with a catalyst solution, spraying, or application can be suitably used. The supported catalyst may be referred to as a "catalyst layer." That is, the catalyst layer may be a layer formed directly on the oxide layer.

The catalyst is supported on the oxide layer by surface adsorption and diffusion into the oxide layer. The catalyst is generally supported in the form of ions. This is reduced in the reduction treatment step described later and reduced to a metal by a reducing agent contained in the plating solution in the formation of an electroless plating film in step IV, and acts as a catalyst core, thus forming a plating film.

When the catalyst is to be metallized in advance before step II, the glass substrate with the oxide layer formed thereon may be sensitized by exposing the substrate to a solution containing divalent tin ions ($Sn^{2+}$) to allow $Sn^{2+}$ to be supported on the oxide layer before step II, and then exposed to a catalyst solution. Alternatively, the glass substrate with the oxide layer formed thereon can be exposed to a catalyst solution and then to a reducing agent before electroless plating, thereby metallizing the catalyst.

When a film of SnO is formed as the oxide layer, the layer contains abundant $Sn^{2+}$, which functions as a reducing agent; thus, a catalyst can be supported in a metallic state in step II.

Specifically, it is preferred that step II of adding a catalyst comprises (II-1) step II-1 of adding a palladium (Pd) to the oxide layer. As stated above, when an electroless copper plating film is formed in step IV as in the production method according to the second embodiment shown in FIG. 4, it is unnecessary to add an Sn catalyst to the oxide layer and subsequently add an Ag catalyst thereto before adding a Pd catalyst and it is preferable that a Pd catalyst is added onto the oxide layer. Specifically, when an electroless copper plating film is formed in step IV as in the production method according to the second embodiment shown in FIG. 4, it is unnecessary to go through step 3-1 and step 3-2 of the first embodiment, and a Pd catalyst can be directly added onto the oxide layer. That is, step II-1 in the production method according to the second embodiment is the same as step 3-3 in the production method according to the first embodiment.

In the step of adding a Pd catalyst to the oxide layer, a catalyst-adding solution containing a Pd catalyst is preferably used. Preferable examples of the Pd compound (Pd catalyst) contained in the Pd catalyst-adding solution include palladium chloride, palladium sulfate, palladium nitrate, palladium acetate, palladium oxide, palladium bromide, and the like. By preferably using palladium chloride, palladium sulfate, palladium nitrate, or the like as a Pd compound (Pd catalyst), a plating film is more sufficiently deposited, and the plating adhesion is improved.

Such Pd compounds can be used singly or in a combination of two or more.

The Pd catalyst-adding solution contains a Pd compound in a concentration of preferably 0.005 g/L or more, more preferably 0.05 g/L or more, even more preferably 0.1 g/L or more, and particularly preferably 0.15 g/L or more, in terms of Pd. The Pd catalyst-adding solution preferably contains the Pd compound in a concentration of 1 g/L or less, more preferably 0.7 g/L or less, and even more preferably 0.5 g/L or less, in terms of Pd. By setting the lower limit of the Pd concentration within the above ranges, a sufficient amount of the Pd catalyst is adsorbed onto the surface of the oxide layer, and an electroless plating film is more sufficiently deposited. By setting the upper limit of the Pd concentration within the above ranges, an electroless plating film with high adhesion can be obtained without excessive adsorption of the Pd catalyst.

The step of adding a Pd catalyst to the surface of the oxide layer is preferably a method in which a catalyst-adding solution containing a Pd catalyst is brought into contact with the oxide layer. The step of adding a Pd catalyst is preferably a method comprising immersing the glass substrate with the oxide layer formed thereon in a Pd catalyst-adding solution, a method comprising spraying a Pd catalyst-adding solution on the surface of the oxide layer, or the like.

The catalyst-adding solution containing a Pd catalyst also preferably contains an inorganic acid, such as hydrochloric acid, nitric acid, sulfuric acid, phosphoric acid, or boric acid.

The pH of the catalyst-adding solution containing a Pd catalyst is preferably a pH of 0.3 to 4.0, more preferably a pH of 0.5 to 3.5, and even more preferably a pH of 1.0 to 3.0. By setting the pH range of the catalyst-adding solution containing a Pd catalyst within the above ranges, a sufficient amount of the Pd catalyst is adsorbed onto the surface of the oxide layer, and an electroless plating film is more sufficiently deposited.

When the glass substrate with the oxide layer formed thereon is immersed in the Pd catalyst-adding solution, the liquid temperature of the Pd catalyst-adding solution is preferably 10° C. or more, more preferably 15° C. or more, and even more preferably 20° C. or more. The liquid temperature of the Pd catalyst-adding solution is preferably 50° C. or less, more preferably 40° C. or less, and even more preferably 30° C. or less. By setting the lower limit of the liquid temperature within the above ranges, a sufficient amount of the Pd catalyst is adsorbed onto the surface of the oxide layer, and an electroless plating film is more sufficiently deposited. By setting the upper limit of the liquid temperature within the above ranges, an electroless plating film with high adhesion can be obtained without excessive adsorption of the Pd catalyst.

When the glass substrate with the oxide layer formed thereon is immersed in the Pd catalyst-adding solution, the treatment time for Pd catalyst addition is preferably several seconds or more, more preferably 10 seconds or more, and even more preferably 30 seconds or more. The treatment time for Pd catalyst addition is preferably 10 minutes or less, more preferably 5 minutes or less, and even more preferably 3 minutes or less. By setting the lower limit of the treatment time for Pd catalyst addition within the above ranges, a sufficient amount of the Pd catalyst is adsorbed onto the surface of the oxide layer, and an electroless plating film is more sufficiently deposited. By setting the upper limit of the treatment time for Pd catalyst addition within the above ranges, an electroless plating film with high adhesion can be obtained without excessive adsorption of the Pd catalyst.

Additives of Catalyst-Adding Solution

The catalyst-adding solution containing, for example, a Pd catalyst preferably further contains various additives, as necessary. Examples of preferable additives include stabilizers, pH buffers, surfactants, and the like.

Preferable examples of stabilizers include lead salts such as lead nitrate and lead acetate; bismuth salts such as bismuth nitrate and bismuth acetate; sulfur compounds such as sodium thiosulfate; and the like. Such stabilizers are added singly or in a combination of two or more. When at least one stabilizer is added, the amount of the stabilizer is preferably, for example, about 0.01 to 100 mg/L.

Preferable examples of pH buffers include acetic acid, boric acid, phosphoric acid, phosphorous acid, and carbonic acid; sodium salts, potassium salts, and ammonium salts of these acids; and the like. Such pH buffers are added singly or in a combination of two or more. When a pH buffer is added, the amount of the pH buffer is preferably about 0.002 to 1 mol/L in view of bath stability etc.

Examples of surfactants that can be preferably used include various surfactants, such as nonionic, anionic, cationic, and amphoteric surfactants. Preferable examples of such surfactants include alkali salts of aromatic or aliphatic sulfonic acid, alkali metal salts of aromatic or aliphatic carboxylic acid, and the like. Such surfactants are added singly or in a combination of two or more. When at least one surfactant is added, the amount of the surfactant is preferably, for example, about 0.01 to 1000 mg/L.

By performing step II described above, a catalyst is added to the oxide layer.

Step III

Step III is a step of removing fluorine in the oxide layer to which the catalyst has been added.

Fluorine remains in the oxide layer formed in step I. This residual fluorine is difficult to remove or volatilize by washing with water or allowing the oxide layer to stand. In addition, when an electroless plating film is formed on the oxide layer to which the catalyst has been added in step II, the residual fluorine is released from the oxide layer, for example, by chemical treatment during lamination or heat treatment after lamination, and thus adversely affects the electroless plating film. Therefore, after the catalyst is added to the oxide layer in step II, step III is performed to remove fluorine.

In the production method according to the second embodiment, after a catalyst is added to the oxide layer in step II, fluorine in the oxide layer is removed in step III. The method of removing fluorine in step III is not particularly limited and is preferably at least one step selected from the group consisting of: a step of annealing (heat-treating) the oxide layer to which the catalyst has been added; and a step of bringing the oxide layer to which the catalyst has been added into contact with an alkaline solution. Of these, the step of annealing (heat-treating) the oxide layer to which the catalyst has been added is preferable. The heat treatment can remove fluorine from the oxide layer to which the catalyst has been added and also allows the catalyst to diffuse well on the oxide layer, thus further improving the adhesion. Step III is preferably performed when an electroless copper plating film is formed as an electroless plating film in step IV described later.

The step of heat-treating the glass substrate to which a Pd catalyst has been added is not particularly limited, and heat treatment can be performed by a known method. The heat treatment step is preferably performed, for example, by heating in a furnace the glass substrate with a Pd catalyst-added oxide layer formed thereon.

The atmosphere for heat treatment is not particularly limited and examples include air atmosphere, vacuum atmosphere, and inert gas atmosphere. Examples of inert gases include argon, helium, nitrogen, ammonia, and the like.

When the glass substrate with a Pd catalyst-added oxide layer formed thereon is heat-treated, the heat treatment temperature is preferably 150° C. or more, more preferably 300° C. or more, even more preferably 400° C. or more, particularly preferably 450° C. or more, and most preferably 500° C. or more. The heat treatment temperature is preferably 800° C. or less, more preferably 750° C. or less, even more preferably 700° C. or less, particularly preferably 600° C. or less, and most preferably 550° C. or less. By preferably setting the temperature of the heat treatment to 150° C. or more and 800° C. or less, fluorine can be more fully removed from the oxide layer and the metal catalyst is firmly adsorbed on the oxide layer, and an electroless plating film with high adhesion strength can be obtained through the metal catalyst.

When the glass substrate with the Pd-added oxide layer formed thereon is heat-treated, the heat treatment time is preferably 1 minute or more, more preferably 2 minutes or more, and even more preferably 5 minutes or more. The heat treatment time is preferably 180 minutes or less, more preferably 120 minutes or less, and even more preferably 60 minutes or less. By preferably setting the heat treatment time to 1 minute or more and 180 minutes or less, the metal catalyst is firmly adsorbed on the oxide layer, and an electroless plating film with high adhesion can be obtained through the metal catalyst.

By performing step III described above, fluorine is removed from the oxide layer to which the catalyst has been added.

Reduction Treatment Step

The production method according to the second embodiment preferably comprises a step of performing a reduction treatment (a reduction treatment step) after step III. The reduction treatment allows the catalyst to diffuse well on the oxide layer and further improves the adhesion. The reduction treatment step may be performed, as in the production method according to the second embodiment shown in FIG. 4, when an electroless copper plating film is formed as an electroless plating film in step IV described later. The reduction treatment does not have to be performed when an electroless nickel-phosphorus plating film or an electroless nickel-boron plating film is formed.

The method for subjecting the glass substrate with a catalyst-added oxide layer formed thereon to a reduction treatment is not particularly limited, and the reduction treatment can be performed by a known method.

The step of performing the reduction treatment can be preferably performed, for example, by a method of performing a reduction treatment using a reduction treatment solution containing at least one alkali selected from the group consisting of alkali metal hydroxides and alkaline earth metal hydroxides, and a reducing agent. The reduction treatment solution may also contain a pH buffer.

The alkali is not particularly limited as long as it is preferably at least one member selected from the group consisting of alkali metal hydroxides and alkaline earth metal hydroxides.

Examples of alkali metal hydroxides include, but are not limited to, lithium hydroxide, sodium hydroxide, potassium hydroxide, rubidium hydroxide, cesium hydroxide, and the like.

Examples of alkaline earth metal hydroxides include, but are not limited to, magnesium hydroxide, calcium hydroxide, strontium hydroxide, barium hydroxide, and the like.

Preferable examples of alkalis include sodium hydroxide, potassium hydroxide, calcium hydroxide, barium hydroxide, and the like, and more preferably sodium hydroxide, potassium hydroxide, and the like.

The concentration of the alkali in the reduction treatment solution is preferably 0.3 to 100 g/L, more preferably 0.5 to 10 g/L, and even more preferably 1 to 5 g/L. By setting the alkali concentration within the above range, the metal catalyst can be efficiently reduced and an electroless copper plating film with high adhesion can be obtained.

The reduction treatment step is preferably a method in which a reduction treatment solution containing a reducing agent is brought into contact with a glass substrate with a heat-treated oxide layer formed thereon. The reduction treatment step is more preferably, for example, a method comprising immersing the glass substrate with a heat-treated oxide layer formed thereon in a reduction treatment solution; a method comprising spraying the reduction treatment solution on the surface of the heat-treated oxide layer; or the like.

The reducing agent is not particularly limited as long as it is a reducing agent capable of depositing the metal of a metal catalyst (core), such as an Sn catalyst, an Ag catalyst, or a Pd catalyst. Reducing agents that can be used in reduction plating can be used.

Preferable examples of the reducing agent include amine compounds such as dimethylamine borane, diethylamine borane, trimethylamine borane, and hydrazine; boron-containing compounds such as sodium borohydride; phosphorus-containing compounds such as hypophosphorous acid, salts of hypophosphorous acid (e.g., sodium hypophosphite, potassium hypophosphite, and ammonium hypophosphite), and hydrates thereof; and the like.

The reducing agent may be, for example, a reducing agent that is both an amine compound and a boron-containing compound. In this case, when the reduction treatment solution contains such a reducing agent, the reduction treatment solution is considered to contain both an amine compound and a boron-containing compound.

Preferable examples of the amine compound include amine borane, hydrazine, hydrazine derivatives, and the like.

Amine borane is an amine borane complex, which is a complex of borane (e.g., $BH_3$) and an amine. The amine that constitutes amine borane may be either a chain amine (acyclic amine) or a cyclic amine, and is preferably a chain amine. Preferable examples of amines that constitute the borane complex include dimethylamine, diethylamine, trimethylamine, triethylamine, methoxyethylamine, dicyclohexylamine, t-butylamine, aminopyridine, ethylenediamine, morpholine, pyridine, piperidine, imidazole, and the like. Of these, dimethylamine, diethylamine, trimethylamine, methoxyethylamine, dicyclohexylamine, and the like are preferred; and dimethylamine and the like are more preferred.

Specific examples of preferred amine boranes include dimethylamine borane (DMAB), diethylamine borane, trimethylamine borane, and the like. By using amine borane, more preferably dimethylamine borane (DMAB), trimethylamine borane, or the like as a reducing agent, a metal catalyst is efficiently reduced and an electroless plating film with high adhesion can be obtained.

The hydrazine derivative is not particularly limited as long as it can be used as a reducing agent for electroless plating.

Preferable examples of the boron-containing compound include borohydride compounds. Specific examples include the amine borane described above, which is also an amine compound, borane complexes other than amine borane (complexes of borane and another compound), alkali metal salts of borohydride (e.g., sodium borohydride), and the like.

Preferable examples of phosphorus-containing compounds include hypophosphorous acid, salts of hypophosphorous acid (e.g., sodium hypophosphite, potassium hypophosphite, and ammonium hypophosphite), phosphorous acid, salts of phosphorous acid (e.g., sodium phosphite, potassium phosphite, and ammonium phosphite), hydrates thereof, and the like.

The reducing agent preferably contains an amine compound. The amine compound preferably contains at least one member selected from the group consisting of amine borane, hydrazine, and hydrazine derivatives; more preferably contains at least one member selected from the group consisting of amine borane and hydrazine; and even more preferably contains amine borane (DMAB etc.).

Such reducing agents can be used singly or in a combination of two or more.

The concentration of the reducing agent in the reduction treatment solution containing a reducing agent is preferably 0.3 g/L or more, more preferably 0.4 g/L or more, and even more preferably 0.5 g/L or more. The concentration of the reducing agent in the reduction treatment solution is preferably 20 g/L or less, more preferably 10 g/L or less, and even more preferably 5 g/L or less. By setting the concentration of the reducing agent in the reduction treatment solution to 0.3 g/L or more and 20 g/L or less, the metal catalyst can be efficiently reduced and an electroless plating film with high adhesion can be obtained.

Examples of pH buffers include boric acid, boron oxide, acetic acid, phosphoric acid, phosphorous acid, and carbonic acid; sodium salts, potassium salts, and ammonium salts thereof; and the like. Such pH buffers can be used singly or in a combination of two or more. The content of the pH buffer in the reduction treatment solution is not particularly limited, and a content capable of adjusting the reduction treatment solution to a pH of about 5 and 12 is preferred. Such a content is, for example, about 2 g/L or more and about 50 g/L or less.

When the heat-treated oxide layer is reduced, the reduction treatment temperature is preferably 25° C. or more, more preferably 40° C. or more, and even more preferably 50° C. or more. The reduction treatment temperature is preferably 80° C. or less, more preferably 75° C. or less, and even more preferably 70° C. or less. By preferably setting the reduction treatment temperature to 25° C. or more and 80° C. or less, the metal catalyst is efficiently reduced and an electroless plating film with high adhesion can be obtained.

When the heat-treated oxide layer is subjected to the reduction treatment, the reduction treatment time is 30 seconds or more, preferably 1 minute or more, and more preferably 2 minutes or more. The reduction treatment time is preferably 15 minutes or less, more preferably 10 minutes or less, and even more preferably 5 minutes or less. By preferably setting the reduction treatment time to 30 seconds or more and 15 minutes or less, a metal catalyst can be efficiently reduced and an electroless plating film with high adhesion can be obtained.

Step IV

Step IV is a step of forming an electroless plating film on the oxide layer to which the catalyst has been added.

Since the plating film of the present invention has an oxide layer, the plating film of the present invention has excellent adhesion to an electroless plating film. Thus, a known electroless plating film may be formed. Examples of such electroless plating films include electroless nickel-phosphorus plating films, electroless copper plating films, electroless nickel-boron plating films, and the like. Of these, electroless nickel-phosphorus plating films and electroless copper plating films are preferred in terms of further improving adhesion to the oxide layer. The production method according to the second embodiment is particularly suitable when an electroless copper plating film is formed in step IV.

The method of forming an electroless copper plating film is not particularly limited. The electroless copper plating film can be formed by a known method. The step of forming an electroless copper plating film is preferably, for example, a method of forming a plating film using an electroless copper plating bath. Each component in the electroless copper plating bath is described below.

Copper Compound

The copper compound is not particularly limited, and known copper compounds used in electroless copper plating baths can be used. Preferable examples of water-soluble copper compounds include copper sulfate, copper chloride, copper nitrate, copper carbonate, copper oxide, copper acetate, copper methanesulfonate, copper sulfamate, copper fluoride, copper 2-hydroxyethanesulfonate, copper 2-hydroxypropanesulfonate, copper pyrophosphate, and the like. Hydrates of these copper compounds may also be used.

Such copper compounds may be used singly or in a combination of two or more.

The copper compound concentration in the electroless copper plating bath is not particularly limited as long as it is a concentration that allows an electroless copper plating film to be produced. The concentration can be appropriately adjusted. The copper compound concentration is preferably, for example, about 0.01 to 100 g/L, more preferably 0.5 to 50 g/L, and even more preferably 1 to 10 g/L, in terms of copper metal. A copper compound concentration of less than 0.01 g/L in terms of copper metal may result in a slow deposition rate, whereas a copper compound concentration of more than 100 g/L may result in a decrease in bath stability. Therefore, the copper compound concentration is preferably within the range described above.

Reducing Agent

Examples of usable reducing agents include various reducing agents that are used in known electroless copper plating solutions. Specific examples include aldehyde compounds such as formaldehyde, and glyoxylic acid; borohydride compounds such as sodium borohydride, potassium borohydride, and dimethylamine borane; hydrazines; and the like. Among these, aldehyde compounds are preferred in terms of excellent plating deposition, and formaldehyde is more preferred.

Such reducing agents can be used singly or in a combination of two or more.

The content of the reducing agent in the electroless plating solution is preferably 1 to 20 g/L, more preferably 2 to 15 g/L, and even more preferably 3 to 9 g/L.

Complexing Agent

A complexing agent is a component effective for suppressing the precipitation of copper compounds and suppressing the decomposition of copper compounds by controlling the copper deposition reaction at an appropriate rate. Various complexing agents that are used in known electroless plating solutions can be used.

Specific examples of complexing agents include oxycarboxylic acids such as tartaric acid and malic acid, and soluble salts thereof; amino compounds such as ethylenediamine and triethanolamine; ethylenediamine derivatives such as ethylenediaminetetraacetic acid, Versenol (N-hydroxyethyl ethylenediamine-N,N',N'-triacetic acid), and Quadrol (N,N,N',N'-tetrahydroxyethylenediamine), and soluble salts thereof; phosphonic acids such as 1-hydroxyethane-1,1-diphosphonic acid, and ethylenediamine tetramethylene phosphonic acid, and soluble salts thereof; and the like.

Such complexing agents can be used singly or in a combination of two or more.

The complexing agent concentration in the electroless copper plating bath is not particularly limited and can be adjusted accordingly. The electroless copper plating bath preferably contains a complexing agent in an amount of about 1 to 100 g/L, more preferably about 2 to 50 g/L, and even more preferably about 5 to 30 g/L. A complexing agent concentration of less than 1 g/L may decrease the bath stability, whereas a complexing agent concentration of more than 100 g/L may decrease the deposition rate. Accordingly, the concentration is preferably within the range described above.

Crystal Grain Refiner

The electroless copper plating bath may contain a crystal grain refiner as an additive for refining copper crystal grains. By incorporating the crystal grain refiner into the electroless copper plating bath, crystal grains of the electroless copper plating are refined and the adhesion of the plating film is further improved.

Examples of the additive include nickel salts, iron salts, cobalt salts, carboxylic acids, salts of carboxylic acids, amines, and the like. Among these, nickel salts and iron salts are preferred, with nickel salts being more preferred, in view of further refining the copper crystal grains and further improving the adhesion of the plating film.

Such crystal grain refiners may be used singly or in a combination of two or more.

The concentration of the crystal grain refiner in the electroless copper plating bath is not particularly limited and can be adjusted accordingly. The electroless copper plating bath preferably contains a crystal grain refiner in an amount of about 0.05 to 10 g/L, more preferably about 0.1 to 5 g/L, even more preferably about 0.2 to 2 g/L, particularly preferably about 0.3 to 1 g/L, and most preferably about 0.5 to 0.9 g/L. When the lower limit of the concentration of the crystal grain refiner is within the above range, the refinement of copper crystal grains is further improved. When the upper limit of the concentration of the crystal grain refiner is within the range described above, the adhesion between the oxide layer and the electroless copper plating film is further improved.

Stabilizers, pH Adjusters, Surfactants, Etc.

The electroless copper plating bath can further contain, in addition to the above components, known additives used in electroless copper plating baths, as necessary. Examples of additives include stabilizers, pH adjusters, surfactants, and the like.

Examples of stabilizers include lead compounds (e.g., lead nitrate and lead acetate), cadmium compounds (e.g., cadmium nitrate and cadmium acetate), thallium compounds (e.g., thallium sulfate and thallium nitrate), antimony compounds (e.g., antimony chloride and potassium antimony tartrate), telluric compounds (e.g., telluric acid and tellurium chloride), chromium compounds (e.g., chromium oxide and chromium sulfate), iron compounds (e.g., iron sulfate and iron chloride), manganese compounds (e.g., manganese sulfate and manganese nitrate), bismuth compounds (e.g., bismuth nitrate and bismuth acetate), tin compounds (e.g., tin sulfate and tin chloride), selenium compounds (e.g., selenic acid and selenous acid), cyanides (e.g., methylcyanide and isopropylcyanide), allyl compounds (e.g., allylamine and diallylamine), and the like.

Such stabilizers can be used singly or in a combination of two or more.

The concentration of the stabilizer in the electroless copper plating bath is not particularly limited and can be, for example, about 0.1 to 500 mg/L. In order to improve the stability of the electroless Ni—P plating bath, the concentration of the stabilizer is preferably about 0.1 mg/L or more. When the concentration of the stabilizer is more than 500 mg/L, the plating film may not be formed in some portions (undeposited areas occur). Therefore, the concentration of the stabilizer is preferably within the range described above.

The pH adjuster is preferably an acid such as hydrochloric acid, sulfuric acid, or phosphoric acid; or an alkali such as sodium hydroxide, potassium hydroxide, or aqueous ammonia.

The electroless copper plating bath preferably has a pH of about 7 to 13, and more preferably about 9 to 12. The pH of the plating bath can be adjusted by using the pH adjuster described above. When the plating bath has a pH of less than 6, undeposition may occur.

Examples of surfactants that can be used include various surfactants, such as nonionic, anionic, cationic, and amphoteric surfactants. Examples include alkali salts of aromatic or aliphatic sulfonic acid; alkali metal salts of aromatic or aliphatic sulfonic acid; and the like. Surfactants can be used singly or in a combination of two or more types. When two or more surfactants are mixed and used, the mixing ratio is not particularly limited and can be appropriately determined.

The concentration of the surfactant in the electroless copper plating bath is not particularly limited and can be, for example, about 0.01 to 1000 mg/L. In order to further improve the pitting prevention effect of the electroless copper plating bath, the concentration of the surfactant is preferably about 0.01 mg/L or more. When the concentration of the surfactant is 1000 mg/L or less, a decrease in deposition due to foaming is further inhibited.

Electroless Plating Method

Step IV of forming an electroless plating film (an electroless plating method) is preferably a step in which a glass substrate with a catalyst-added oxide layer formed thereon (an object to be plated) is brought into contact with an electroless plating bath.

The object to be plated is a glass substrate with a Pd catalyst-added oxide layer formed on the surface. Specifically, it is a glass substrate having formed thereon an oxide layer that has been subjected to step III, a reduction treatment, or like treatment after Pd catalyst addition in step II.

The method of bringing the object to be plated into contact with the electroless plating bath is not particularly limited and can be performed according to a usual method. Step IV is preferably, for example, a method of immersing the object to be plated in an electroless plating bath.

The plating treatment conditions (e.g., bath temperature and plating treatment time) are not particularly limited and can be appropriately determined as long as they are conditions under which an electroless plating film is formed.

The bath temperature of the electroless plating bath in the plating step can be determined according to the composition of the plating bath etc. For example, the bath temperature of the electroless copper plating bath in the plating step can be preferably set to about 20° C. or more, more preferably about 25° C. to 80° C., and even more preferably about 30° C. to 70° C. When the bath temperature is less than 25° C., the deposition rate of the plating film is slow and production efficiency may decrease. Therefore, the bath temperature is preferably within the range described above.

The treatment time in the plating step is not particularly limited and can be the time it takes until an electroless plating film of the required thickness is formed on the object to be plated. Specifically, the treatment time in the plating step can be determined according to the composition of the plating bath, the type of object to be plated, etc. For example, the treatment time can be preferably about 1 to 60 minutes, and more preferably about 3 to 40 minutes.

By performing step IV described above, an electroless plating film is formed on the oxide layer to which the catalyst has been added.

Rust Prevention Treatment Step 1

The production method according to the second embodiment may have a rust prevention treatment step 1 between step IV and step V. When the production method according to the second embodiment comprises a rust prevention treatment step 1 between step IV and step V, the formation of copper oxide on the surface of the electroless plating film can be suppressed. In particular, when heating is performed in air in heat treatment step 1 described later, the formation of copper oxide can be suppressed.

The rust prevention treatment method is not particularly limited as long as it is a rust prevention treatment method usually used in the formation of plating films. Examples include a method of immersion in a rust prevention treatment solution containing, for example, phosphate such as polyphosphate, phosphonate, or orthophosphate; silicate; metasilicate; chromate; benzotriazole; tolyltriazole; mercatobenzothiazole; or the like.

Heat Treatment Step 1

The production method of the present invention may comprise a heat treatment (annealing) step 1 as a step that is provided between step IV and step V, and that is after rust prevention treatment step 1. When the production method according to the second embodiment comprises heat treatment step 1, moisture contained in the electroless plating film can be removed, which further improves the adhesion of the electroless plating film.

The heat treatment method in heat treatment step 1 is not particularly limited as long as it is a heat treatment method generally used in the formation of plating films. Examples include a method of placing the glass substrate in a thermostatic bath; a method of placing the glass substrate in a heating furnace or an electric furnace; and the like. The atmosphere for heat treatment is not particularly limited. For example, air atmosphere, vacuum atmosphere, inert gas atmosphere, or the like can be used. Examples of the inert gas include argon, helium, nitrogen, ammonia, and the like.

The heat treatment temperature in heat treatment step 1 is not particularly limited as long as it is a heating temperature generally used in the formation of plating films. The heat treatment temperature is preferably 40 to 400° C., and more preferably 50 to 300° C.

The heat treatment time in heat treatment step 1 is not particularly limited as long as it is substantially the same as the heating time normally used in the formation of plating films. The heat treatment time may be about 30 minutes to about 3 hours.

Step (V)

Step V is a step of forming an electrolytic copper plating film on the electroless plating film.

Step V in the production method according to the second embodiment is the same as step 5 described above in the production method according to the first embodiment. An electrolytic copper plating film is formed on the electroless plating film under the same conditions as in step 5.

Rust Prevention Treatment Step 2

The production method according to the second embodiment may comprise a rust prevention treatment step 2 after step V. When the production method of the present invention comprises a rust prevention treatment step after step V, the formation of copper oxide on the surface of the electrolytic copper plating film can be suppressed. In particular, when the electrolytic copper plating film is heated in air in heat treatment step 2 described later, the formation of copper oxide can be suppressed.

The rust prevention treatment method is not particularly limited as long as it is a rust prevention treatment method normally used in the formation of plating films. Examples of methods include a method of immersion in a rust prevention treatment solution containing, for example, phosphate such as polyphosphate, phosphonate, or orthophosphate; silicate; metasilicate; chromate; benzotriazole; tolyltriazole; mercatobenzothiazole; or the like.

Heat Treatment Step 2

The production method of the present invention may comprise a heat treatment (annealing) step 2 after step V or after rust prevention treatment step 2. When the production method according to the second embodiment comprises heat treatment step 2, moisture contained in the electroless plating film and the electrolytic plating film can be removed, and the metal copper diffuses into the oxide layer from the electroless copper plating film and the electrolytic copper plating film, which further improves the adhesion of the plating film.

The heat treatment method in heat treatment step 2 is not particularly limited as long as it is a heat treatment method normally used in the formation of plating films. Examples include a method of placing the glass substrate in a thermostatic bath; a method of placing the glass substrate in a heating furnace or an electric furnace; and the like. The atmosphere for heat treatment is not particularly limited. For example, air atmosphere, vacuum atmosphere, inert gas atmosphere, or the like can be used. Examples of the inert gas include argon, helium, nitrogen, ammonia, and the like.

The heat treatment temperature in heat treatment step 2 is not particularly limited as long as it is a heating temperature normally used in the formation of plating films. The heat treatment temperature is preferably 40 to 600° C., more preferably 50 to 500° C., even more preferably 100 to 400° C., particularly preferably 200 to 400° C., and most preferably 300 to 400° C.

The heat treatment time in heat treatment step 2 is not particularly limited as long as it is substantially the same as the heating time normally used in the formation of plating films. The heat treatment time may be about 30 minutes to about 3 hours.

In heat treatment step 2, the time to reach the maximum temperature is preferably 90 minutes or more. The temperature-rising method to reach the maximum temperature may be a multi-stage temperature rise. Examples of the multi-stage temperature rise include a multi-stage temperature rise of: room temperature→10-minute temperature rise→30-minute temperature maintenance at 180° C.→10-minute temperature rise→30-minute temperature maintenance at 250° C.→10-minute temperature rise→60-minute temperature maintenance at 370° C. The temperature rise method may be a slope temperature rise. Examples of the slope temperature rise include a slope temperature rise of: room temperature→temperature rise for 90 minutes→temperature maintenance at 370° C. for 60 minutes.

The production method according to the second embodiment can be preferably applied when an electroless copper plating film is formed in step IV of forming an electroless plating film. Table 2 below shows specific conditions etc. in one example of the production method according to the second embodiment.

TABLE 2

| Step | Main component | Temperature | Time |
| --- | --- | --- | --- |
| Oxide film formation ↓ | LPD method | | |
| Pd addition ↓ | Pd salt Inorganic aid | 25° C. | 3 min. |
| Baking (Air) ↓ | | 550° C. | 1 hour |
| Reduction ↓ | Reducing agent | 25° C. | 30 sec. |

TABLE 2-continued

| Step | Main component | Temperature | Time |
|---|---|---|---|
| Electroless copper plating | Cu salt<br>Ni salt<br>Reducing agent<br>Complexing agent<br>Stabilizer<br>pH adjuster | 32° C. | 30 minutes<br>Film thickness: about 0.8 μm |
| ↓ Rust prevention | Aromatic compound | 25° C. | 10 sec. |
| ↓ Baking (Air) | — | 150° C. | 60 min. |
| ↓ Copper sulfate plating | Copper sulfate·5H$_2$O<br>98% sulfuric acid<br>chloride ion<br>Polymer<br>Leveler<br>Brightener | 25° C. | 50 min.<br>(1 A/dm$^2$)<br>Film thickness: about 10 μm |
| ↓ Rust prevention | Aromatic compound | 25° C. | 10 sec. |
| ↓ Annealing (nitrogen atmosphere) | — | 180° C.<br>↓<br>250° C.<br>↓<br>370° C. | 30 min.<br>↓ 10 min.<br>30 min.<br>↓ 10 min.<br>50 min. |

3. Applications of Plating Film

The plating film of the present invention has good adhesion to glass substrates. Further, the plating film of the present invention has good adhesion to electrolytic copper plating films. The plating film of the present invention is preferably used for printed wiring boards of electronic devices.

The communication speed of electronic devices has been increasing and high frequency is used to increase the communication speed. Therefore, smoothness is important for base materials on which wiring is formed.

The plating film of the present invention exhibits a good adhesion through plating deposition when a smooth glass base material is subjected to plating. The plating film of the present invention exhibits smoothness on a glass base material (e.g., base materials on which wiring is formed and glass substrates) and can form wiring. The plating film of the present invention is most appropriate for the production of electronic devices with increasing communication speeds.

EXAMPLES

The present invention is described below in more detail with reference to Examples and Comparative Examples. However, the present invention is not limited to the Examples.

Production Method According to the First Embodiment

The plating films of the Examples and Comparative Examples were produced on glass substrates by the following production method.

An oxide layer was formed on a glass substrate by the LPD method. Specifically, alkali-free glass was prepared as a glass substrate. As a preliminary washing step, the glass substrate was immersed in 1M sodium hydroxide under ultrasonic irradiation for 10 minutes. The glass substrate was further immersed in 0.1M hydrofluoric acid (HF) under ultrasonic irradiation for 10 minutes, and then washed with pure water. The type of film of the oxide layer was tin oxide, titanium oxide, or a mixture thereof (tin oxide+titanium oxide), as shown in the tables.

When the type of film of the oxide layer was tin oxide, a reaction solution containing 0.01M tin(II) fluoride (SnF$_2$: CAS No. 7783-47-3), and further containing 0.1M boric acid (H$_3$BO$_3$: CAS No. 10043-35-3) and 0.3M hydrogen peroxide (H$_2$O$_2$) as additives was used as a reaction solution containing fluorine and an oxide precursor ion.

When the type of film of the oxide layer was titanium oxide, a reaction solution containing 0.3M ammonium hexafluorotitanate ((NH$_4$)$_2$TiF$_6$: CAS No. 16962-40-2) and further containing 0.1M boric acid (H$_3$BO$_3$) as an additive was used as a reaction solution containing fluorine and an oxide precursor ion.

When the type of film of the oxide layer was a mixture of tin oxide and titanium oxide (tin oxide+titanium oxide), a mixture of the reaction solution used when the type of film of the oxide layer was tin oxide with the reaction solution used when the type of film of the oxide layer was titanium oxide was used as a reaction solution containing fluorine and an oxide precursor ion.

In all the above cases, the reaction time was changed to adjust the film thickness as shown in Tables 3 to 5.

The thus-prepared glass substrates with an oxide layer formed thereon were subjected to annealing under the temperature and time conditions shown in Tables 3 to 5, and fluorine contained in the oxide layer was removed.

The glass substrate with the oxide layer formed thereon was washed with pure water, then immersed in 0.1M tin chloride (SnCl$_2$) for 2 minutes, washed with pure water, and dried with a nitrogen blow.

After drying, the glass substrate was subjected to an Sn catalyst addition step, an Ag catalyst addition step, a Pd catalyst addition step, a heat treatment step, and a reduction treatment step under the following conditions by performing a combination of the steps shown in Table 1, thus adding the catalyst onto the oxide layer.

Sn Catalyst Addition Step
  Composition and Concentration
    Tin chloride-2H$_2$O: 1.5 g/L
    Tin borohydride: 1.5 g/L
    pH=1.8
  Temperature and Time
    25° C., 2 minutes
Ag Catalyst Addition Step
  Composition and Concentration
    Silver nitrate: 0.8 g/L
    pH=5.3
  Temperature and Time
    25° C., 1 minute
Pd Catalyst Addition Step
  Composition and Concentration
    Palladium(II) chloride: 0.3 g/L
    pH=1.8
  Temperature and Time
    25° C., 1 min.

A glass substrate with a catalyst-added oxide layer formed thereon was subjected to electroless Ni—P plating. The electroless Ni—P plating bath used in the electroless Ni—P plating had a basic composition containing 12.15 g/L of 6H$_2$O, 6 g/L of glycine, and 6 g/L of glycine, and further containing sodium hypophosphite; and a complexing agent, a stabilizer, and a pH adjuster were added thereto to adjust the pH. The concentration of sodium hypophosphite (Na hypophosphite) in the electroless Ni—P plating bath was as described in the tables below. The temperature and time conditions for the electroless Ni—P plating bath are as follows.

Temperature and Time
50° C., 10 minutes
Glass substrates subjected to electroless Ni—P plating were placed in a thermostatic bath and subjected to a heat treatment (annealing). The temperature and time conditions for the heat treatment are as follows.
(Heat Treatment (Annealing Step))
Temperature and Time
50° C., 1 hour
The electroless Ni—P plating film was subjected to electrolytic copper plating under the following conditions.
Electrolytic Copper Plating Step
Composition and Concentration
Copper sulfate-5H$_2$O: 200 g/L
98% sulfuric acid: 100 g/L
35% hydrochloric acid: 0.15 g/L
Top Lucina SET (additive for copper sulfate plating, produced by Okuno Pharmaceutical Industries Co., Ltd.)
Temperature and Time
25° C., 50 minutes
Current Density
1 A/dm$^2$ (film thickness: 10 μm)
A plating film was formed on the glass substrate by the method described above.

Evaluation
The plating films thus produced in the Examples and Comparative Examples were evaluated by the following methods.
(1) Thickness of Plating Film
The thickness of each plating film was measured using an X-ray fluorescence film thickness meter.
(2) Content of Phosphorus in Electroless Ni—P Plating Film
The content of phosphorus (phosphorus content) in the electroless Ni—P plating film was determined using an X-ray photoelectron spectroscopy analyzer (XPS).
(3) Adhesion of Plating Film (Peel Strength)
Peel strength was measured using a table-top precision universal tester (AGS-X, produced by Shimadzu Corporation) at a crosshead speed of 100 mm/min under the following conditions: measuring direction 90° and test stroke 50 mm. The evaluation was performed according to the following evaluation criteria.
A: 1N/cm or more
B: Less than 1N/cm
(4) Surface Roughness of Oxide Layer (Ra)
The surface roughness (Ra) of the oxide layer was measured using a shape analysis laser microscope.
The tables below show the results.

TABLE 3

| | LPD | | | | Electroless Ni—P plating | |
|---|---|---|---|---|---|---|
| | Type of oxide | Ra (nm) | Film thickness (nm) | Annealing | Catalyst addition step | Sodium hypophosphite (g/L) | Plating time (min) |
| Example 1-1 | Tin oxide | 8 | 60 | 150° C. for 2 hr | Sn/Ag/Pd | 20 | 10 |
| Example 1-2 | Tin oxide | 8 | 60 | 150° C. for 2 hr | Sn/Ag/Pd | 30 | 5 |
| Example 1-3 | Tin oxide | 8 | 60 | 150° C. for 2 hr | Sn/Ag/Pd | 30 | 10 |
| Example 1-4 | Tin oxide | 8 | 60 | 150° C. for 2 hr | Sn/Ag/Pd | 30 | 20 |
| Example 1-5 | Tin oxide | 8 | 60 | 150° C. for 2 hr | Sn/Ag/Pd | 40 | 5 |
| Example 1-6 | Tin oxide | 8 | 60 | 150° C. for 2 hr | Sn/Ag/Pd | 40 | 10 |
| Example 1-7 | Tin oxide | 8 | 60 | 150° C. for 2 hr | Sn/Ag/Pd | 40 | 20 |
| Example 1-8 | Tin oxide | 8 | 60 | 150° C. for 2 hr | Sn/Ag/Pd | 48 | 5 |
| Example 1-9 | Tin oxide | 8 | 60 | 150° C. for 2 hr | Sn/Ag/Pd | 48 | 10 |
| Example 1-10 | Tin oxide | 8 | 60 | 150° C. for 2 hr | Sn/Ag/Pd | 48 | 35 |
| Example 1-11 | Tin oxide | 8 | 60 | 150° C. for 2 hr | Sn/Ag/Pd | 48 | 20 |
| Example 1-12 | Tin oxide | 8 | 60 | 150° C. for 2 hr | Sn/Ag/Pd | 48 | 30 |
| Example 1-13 | Tin oxide | 8 | 60 | 150° C. for 2 hr | Sn/Ag/Pd | 60 | 5 |
| Example 1-14 | Tin oxide | 8 | 60 | 150° C. for 2 hr | Sn/Ag/Pd | 60 | 10 |
| Example 1-15 | Tin oxide | 8 | 60 | 150° C. for 2 hr | Sn/Ag/Pd | 60 | 20 |
| Example 1-16 | Tin oxide | 8 | 60 | 150° C. for 2 hr | Sn/Ag/Pd | 80 | 5 |
| Example 1-17 | Tin oxide | 8 | 60 | 150° C. for 2 hr | Sn/Ag/Pd | 80 | 10 |
| Example 1-18 | Tin oxide | 8 | 60 | 150° C. for 2 hr | Sn/Ag/Pd | 80 | 20 |
| Example 1-19 | Tin oxide | 8 | 60 | 150° C. for 2 hr | Sn/Ag/Pd | 100 | 10 |
| Example 1-20 | Tin oxide | 8 | 60 | 150° C. for 2 hr | Sn/Ag/Pd | 100 | 20 |

| | Electroless Ni—P plating | | Electrolytic copper plating | | Adhesion | |
|---|---|---|---|---|---|---|
| | Film thickness (μm) | Content of phosphorus (wt %) | Plating bath | Temperature, time | Peel strength (N/cm) | Evaluation |
| Example 1-1 | 0.5 | 7.3 | Copper sulfate | 25° C., 50 min | 1.0 | A |
| Example 1-2 | 0.5 | 8.5 | Copper sulfate | 25° C., 50 min | 1.6 | A |
| Example 1-3 | 0.8 | 6 | Copper sulfate | 25° C., 50 min | 2.4 | A |
| Example 1-4 | 12 | 4 | Copper sulfate | 25° C., 50 min | 1.0 | A |
| Example 1-5 | 0.5 | 14.2 | Copper sulfate | 25° C., 50 min | 1.6 | A |
| Example 1-6 | 0.8 | 9.5 | Copper sulfate | 25° C., 50 min | 2.4 | A |
| Example 1-7 | 1.4 | 5.6 | Copper sulfate | 25° C., 50 min | 2.8 | A |
| Example 1-8 | 0.5 | 8.9 | Copper sulfate | 25° C., 50 min | 1.8 | A |
| Example 1-9 | 0.8 | 8.7 | Copper sulfate | 25° C., 50 min | 2.3 | A |
| Example 1-10 | 1.1 | 84 | Copper sulfate | 25° C., 50 min | 2.2 | A |
| Example 1-11 | 1.4 | 8.3 | Copper sulfate | 25° C., 50 min | 2.1 | A |
| Example 1-12 | 2.7 | 8.8 | Copper sulfate | 25° C., 50 min | 1.2 | A |
| Example 1-13 | 0.5 | 18.7 | Copper sulfate | 25° C., 50 min | 1.3 | A |

TABLE 3-continued

| | | | | | | |
|---|---|---|---|---|---|---|
| Example 1-14 | 0.8 | 11.5 | Copper sulfate | 25° C., 50 min | 2.2 | A |
| Example 1-15 | 1.5 | 7.9 | Copper sulfate | 25° C., 50 min | 2.4 | A |
| Example 1-16 | 0.5 | 21.8 | Copper sulfate | 25° C., 50 min | 1.0 | A |
| Example 1-17 | 1 | 16.5 | Copper sulfate | 25° C., 50 min | 1.9 | A |
| Example 1-18 | 1.5 | 9.6 | Copper sulfate | 25° C., 50 min | 2.5 | A |
| Example 1-19 | 0.6 | 14.6 | Copper sulfate | 25° C., 50 min | 1.5 | A |
| Example 1-20 | 1.1 | 11.1 | Copper sulfate | 25° C., 50 min | 2.0 | A |

TABLE 4

| | LPD | | | | Electroless Ni—P plating | |
|---|---|---|---|---|---|---|
| | Type of oxide | Ra (nm) | Film thickness (nm) | Annealing | Catalyst addition step | Sodium hypophosphite (g/L) | Plating time (min) |
| Example 1-21 | Tin oxide | 8 | 60 | 150° C. for 2 hr | Sn/Pd | 48 | 10 |
| Example 1-22 | Tin oxide | 8 | 60 | 150° C. for 2 hr | Sn/Pd | 48 | 20 |
| Example 1-23 | Tin oxide | 8 | 60 | 150° C. for 2 hr | Sn/Pd × 2 | 48 | 5 |
| Example 1-24 | Tin oxide | 8 | 60 | 150° C. for 2 hr | Sn/Pd × 2 | 48 | 10 |
| Example 1-25 | Tin oxide | 8 | 60 | 150° C. for 2 hr | Sn/Pd × 2 | 48 | 15 |
| Example 1-26 | Tin oxide | 8 | 60 | 150° C. for 2 hr | Sry/Pd × 2 | 48 | 20 |
| Example 1-27 | Tin oxide | 8 | 60 | 150° C. for 2 hr | Sn/Pd × 3 | 48 | 10 |
| Example 1-28 | Tin oxide | 8 | 60 | 150° C. for 2 hr | Sn/Pd × 4 | 48 | 10 |
| Example 1-29 | Tin oxide | 8 | 60 | 150° C. for 2 hr | Srv/Pd × 5 | 48 | 10 |

| | Electroless Ni—P plating | | Electrolytic copper plating | | Adhesion | |
|---|---|---|---|---|---|---|
| | Film thickness (μm) | Content of phosphorus (wt %) | Plating bath | Temperature, time | Peel strength (N/cm) | Evaluation |
| Example 1-21 | 0.8 | 9.1 | Copper sulfate | 25° C., 50 min | 1.2 | A |
| Example 1-22 | 1.3 | 6.8 | Copper sulfate | 25° C., 50 min | 1.2 | A |
| Example 1-23 | 0.5 | 17.5 | Copper sulfate | 25° C., 50 min | 1.8 | A |
| Example 1-24 | 0.7 | 11.5 | Copper sulfate | 25° C., 50 min | 2.4 | A |
| Example 1-25 | 0.9 | 8 | Copper sulfate | 25° C., 50 min | 2.5 | A |
| Example 1-26 | 1.3 | 7 | Copper sulfate | 25° C., 50 min | 2.5 | A |
| Example 1-27 | 0.8 | 8.8 | Copper sulfate | 25° C., 50 min | 28 | A |
| Example 1-28 | 0.9 | 8.4 | Copper sulfate | 25° C., 50 min | 2.7 | A |
| Example 1-29 | 0.7 | 8.6 | Copper sulfate | 25° C., 50 min | 2.5 | A |

The descriptions "Sn/Pd×2," "Sn/Pd×3," etc. in the "Catalyst addition step" column in Table 4 indicate that when Sn catalyst addition and subsequent Pd catalyst addition are defined as one set of steps, 2 sets, 3 sets, etc. were performed. In this case, no Ag catalyst was added.

TABLE 5

| | LPD | | | | Electroless Ni—P plating | | |
|---|---|---|---|---|---|---|---|
| | Type of oxide | Ra (nm) | Film thickness (nm) | Annealing | Catalyst addition step | Sodium hypophosphite (g/L) | Plating time (min) |
| Example 1-30 | Tin oxide | 8 | 60 | 550° C. for 1 hour | Sn/Ag/Pd | 48 | 10 |
| Example 1-31 | Titanium oxide | 45 | 50 | 150° C. for 2 hours | Sn/Ag/Pd | 48 | 10 |
| Example 1-32 | Titanium oxide | 45 | 50 | 550° C. for 1 hour | Sn/Ag/Pd | 48 | 10 |
| Example 1-33 | Tin oxide + titanium oxide | 71 | 135 | 150° C. for 2 hours | Srv/Ag/Pd | 48 | 10 |
| Example 1-34 | Tin oxide + titanium oxide | 71 | 135 | 550° C. for 1 hour | Srv/Ag/Pd | 48 | 10 |

| | Electroless Ni—P plating | | Electrolytic copper plating | | Adhesion | |
|---|---|---|---|---|---|---|
| | Film thickness (μm) | Content of phosphorus (wt %) | Plating bath | Temperature, time | Peel strength (N/cm) | Evaluation |
| Example 1-30 | 0.8 | 9.1 | Copper sulfate | 25° C., 50 min | 1.8 | A |
| Example 1-31 | 0.7 | 8.6 | Copper sulfate | 25° C., 50 min | 1 | A |
| Example 1-32 | 0.8 | 8.9 | Copper sulfate | 25° C., 50 min | 1.6 | A |
| Example 1-33 | 0.8 | 8.2 | Copper sulfate | 25° C., 50 min | 25 | A |
| Example 1-34 | 0.8 | 9.9 | Copper sulfate | 25° C., 50 min | 21 | A |

TABLE 6

| | LPD | | | | Electroless Ni—P plating | | |
|---|---|---|---|---|---|---|---|
| | Type of oxide | Ra (nm) | Film thickness (nm) | Annealing | Catalyst addition step | Sodium hypophosphite (g/L) | Plating time (min) |
| Comparative Example 1-1 | No | <1 | — | No | Sn/Ag/Pd | 48 | 5 |
| Comparative Example 1-2 | No | <1 | — | No | Sn/Ag/Pd | 48 | 10 |
| Comparative Example 1-3 | No | <1 | — | No | Sn/Ag/Pd | 48 | 20 |
| Comparative Example 1-4 | No | <1 | — | No | Sn/Ag/Pd | 48 | 30 |

| | Electroless Ni—P plating | | Electrolytic copper plating | | Adhesion | |
|---|---|---|---|---|---|---|
| | Film thickness (μm) | Content of phosphorus (wt %) | Plating bath | Temperature, time | Peel strength (N/cm) | Evaluation |
| Comparative Example 1-1 | 0.26 | 9.5 | Copper sulfate | 25° C., 50 min | 0 | 8 |
| Comparative Example 1-2 | 0.59 | 10.1 | Copper sulfate | 25° C., 50 min | 0 | 8 |
| Comparative Example 1-3 | 1.11 | 9.7 | Copper sulfate | 25° C., 50 min | 0 | 8 |
| Comparative Example 1-4 | 1.4 | 9.1 | Copper sulfate | 25° C., 50 min | 0 | 8 |

Second Embodiment

The plating films of the Examples and Comparative Examples were formed on glass substrates by the following production method.

An oxide layer was formed on a glass substrate by the LPD method. Specifically, alkali-free glass was prepared as a glass substrate. As a preliminary washing, the glass substrate was immersed in 1M sodium hydroxide under ultrasonic irradiation for 10 minutes. The glass substrate was further immersed in 0.1M hydrofluoric acid (HF) under ultrasonic irradiation for 10 minutes and then washed with pure water. As shown in the tables below, the type of film of the oxide layer was tin oxide, titanium oxide, or a mixture thereof (tin oxide+titanium oxide), as shown in the tables below.

When the type of film of the oxide layer was tin oxide, a reaction solution containing 0.01M of tin(II) fluoride ($SnF_2$: CAS No. 7783-47-3), and further containing 0.1M boric acid ($H_3BO_3$: CAS No. 10043-35-3) and 0.3M hydrogen peroxide ($H_2O_2$) as additives was used as a reaction solution containing fluorine and an oxide precursor ion.

When the type of film of the oxide layer was titanium oxide, a reaction solution containing 0.3M ammonium hexafluorotitanate (($NH_4)_2TiF_6$: CAS No. 16962-40-2) and further containing 0.1M boric acid ($H_3BO_3$) as an additive was used as a reaction solution containing fluorine and an oxide precursor ion.

When the type of film of the oxide layer was a mixture of tin oxide and titanium oxide (tin oxide+titanium oxide), a mixture of the reaction solution used when the type of film of the oxide layer was tin oxide with the reaction solution used when the type of film of oxide layer was titanium oxide was used as a reaction solution containing fluorine and an oxide precursor ion.

In all the above cases, the reaction time was changed to adjust the film thickness as shown in Tables 7 to 12.

The glass substrate with the oxide layer formed thereon was washed with pure water, then immersed in 0.1M tin (II) chloride ($SnCl_2$) for 2 minutes, washed with pure water, and dried with a nitrogen blow.

After drying, a Pd catalyst addition step was performed under the following conditions and the catalyst was added onto the oxide layer.
Pd Catalyst Addition Step
Composition and Concentration
 Palladium(II) chloride: 0.3 g/L
 pH=1.8
Temperature and Time
 25° C., 3 minutes The thus-prepared glass substrates with a catalyst-added oxide layer formed thereon were annealed under the atmosphere, temperature, and time conditions shown in Tables 7 to 12, and fluorine contained in the oxide layer was removed.

A glass substrate with a catalyst-added oxide layer formed thereon was subjected to electroless copper plating. The electroless copper plating bath used in electroless copper plating had a basic composition comprising 8.6 g/L of copper sulfate·$5H_2O$, 2.0 g/L of formaldehyde (a reducing agent), and 20 g/L of tartaric acid (complexing agent) in water as a solvent, and a complexing agent, a stabilizer, and a pH adjuster were added thereto to adjust the pH. A crystal grain refiner was added to the electroless copper plating bath in an amount shown in Tables 7 to 12. The temperature and time conditions for the electroless copper plating bath were as follows.

Temperature and Time
 32° C., 30 minutes

The thus formed electroless copper plating film was subjected to a rust prevention treatment in the rust prevention treatment step. The rust prevention treatment was performed by immersing, in a rust prevention solution, the glass substrate with an oxide layer and an electroless copper plating film formed thereon. The composition of the rust prevention solution and the conditions for the rust prevention treatment were as follows.
Rust Prevention Treatment Step
Composition and Concentration
 Benzotriazole (aromatic compound): 0.15 g/L
Temperature and Time
 25° C., 10 seconds Glass substrates subjected to a rust prevention treatment step and then to electroless copper plating were annealed under the atmosphere, temperature, and time conditions shown in Tables 7 to 12, and moisture in the electroless plating film was removed.

Subsequently, the electroless copper plating film was subjected to electrolytic copper plating under the following conditions.
Electrolytic Copper Plating Step
Composition and Concentration
 Copper sulfate·$5H_2O$: 70 g/L
 98% sulfuric acid: 200 g/L
 35% hydrochloric acid: 0.15 g/L
 Top Lucina SF (Additive for copper sulfate plating, produced by Okuno Pharmaceutical Industries Co., Ltd.)
Temperature and Time
 25° C., 50 minutes
Current Density
 1 $A/dm^2$ (film thickness: 10 µm)

The thus-prepared glass substrates with a plating film formed thereon were annealed under the atmosphere, temperature, and time conditions shown in Tables 7 to 12, and moisture in the electroless plating film and the electrolytic copper plating film was removed. Metal copper was allowed to diffuse from the electroless copper plating film and the electrolytic copper plating film into the oxide layer.

Using the method described above, each plating film was formed on the glass substrate.
Evaluation The thus-produced plating films of the Examples and Comparative Examples were evaluated by the following methods.
(1) Thickness of Plating Film The thickness of each plating film was measured using an X-ray fluorescence film thickness meter.
(2) Average Crystal Grain Size of Electroless Copper Plating Film The average crystal grain size of the electroless plating film was measured by the measurement method shown in FIGS. 1 and 2. FIG. 1 is an SEM image of an interface portion (up to 300 nm from the interface) between an oxide layer and an electroless plating film on a glass substrate. FIG. 2 is an enlarged view of crystal grains in FIG. 1. Specifically, as shown in FIG. 1, an SEM image of the interface portion (up to 300 nm from the interface) between the oxide layer and the electroless plating film on the glass substrate is taken; as shown in FIG. 2, the greatest diameter of a crystal grain in the vertical direction (direction perpendicular to the interface portion in the SEM image) and the greatest diameter of the crystal grain in the transverse direction (direction horizontal to the interface portion in the SEM image) are measured, and the crystal grain size is calculated based on the following formula.

Crystal grain size (nm)=(greatest diameter (nm) in vertical direction+greatest diameter (nm) in transverse direction)/2

The crystal grain size is measured at 15 points of each electroless plating film, and the average value is defined as the average crystal grain size.

(3) Adhesion of Plating Film (Peel Strength)

The peel strength was measured using a table-top precision universal tester (AGS-X, produced by Shimadzu Corporation) under the following conditions: crosshead speed 100 mm/min; measuring direction 90°; and test stroke 50 mm, and evaluated according to the following evaluation criteria. When evaluated as A or B, the obtained plating film is determined to be usable in actual use.
A: 3N/cm or more
B: 1N/cm or more and less than 3N/cm
C: Less than 1N/cm (4) Surface Roughness of Oxide Layer (Ra)

The surface roughness (Ra) of the oxide layer was measured using a shape analysis laser microscope.

The tables below show the results.

TABLE 7

| | LPD | | | | | Electroless copper plating | | | |
|---|---|---|---|---|---|---|---|---|---|
| | | | | | | | Crystal grain refiner | | |
| | Type of oxide | Ra (nm) | Film thickness (nm) | Catalyst addition step | Annealing | Kind | Concentration (g/L) | Film thickness (μm) | Rust prevention treatment |
| Example 2-1 | Tin oxide | 3 | 10 | Pd | Air 550° C.; 1 hr | Ni | 0.3 | 0.8 | Yes |
| Example 2-2 | | | 20 | | | | | 0.8 | |
| Example 2-3 | | | 30 | | | | | 0.8 | |
| Example 2-4 | | | 40 | | | | | 0.9 | |
| Example 2-5 | | | 50 | | | | | 0.8 | |
| Example 2-6 | Titanium oxide | 10 | 30 | | | | | 0.8 | |
| Com. Ex. 2-1 | None | — | — | | | | | 0.8 | |

| | | Electrolytic copper plating | | | Average crystal particle diameter (nm) | Adhesion | |
|---|---|---|---|---|---|---|---|
| | Annealing | Plating bath | Temperature, time | Annealing | | Peel strength (N/cm) | Evaluation |
| Example 2-1 | Air 150° C. 1 hr | Copper sulfate | 25 °C 50 min | Ni 180° C. 30 min → 250° C. 30 min → 370° C. 50 min | 80 | 4.0 | A |
| Example 2-2 | | | | | 84 | 5.0 | A |
| Example 2-3 | | | | | 76 | 4.9 | A |
| Example 2-4 | | | | | 78 | 5.1 | A |
| Example 2-5 | | | | | 80 | 4.9 | A |
| Example 2-6 | | | | | 79 | 4.0 | A |
| Com. Ex. 2-1 | | | | | 79 | <0.1 | C |

TABLE 8

| | LPD | | | | | Electroless copper plating | | | |
|---|---|---|---|---|---|---|---|---|---|
| | | | | | | Crystal grain refiner | | | |
| | Type of oxide | Ra (nm) | Film thickness (nm) | Catalyst addition step | Annealing | Type | Concentration (g/L) | Film thickness (μm) | Rust prevention treatment |
| Example 2-7 | Tin oxide | 3 | 30 | Pd | Air 300° C., 1 hr | N | 0.3 | 0.8 | Yes |
| Example 2-8 | | | | | 300° C., 2 hr | | | 0.8 | |

TABLE 8-continued

| | | | | | |
|---|---|---|---|---|---|
| Example 2-9 | | | 400° C., 1 hr | | 0.8 |
| Example 2-10 | | | 550° C. 1 hr | | 0.8 |
| Example 2-11 | | Ni | 300° C., 1 hr | | 0.8 |
| Example 2-12 | | | 300° C., 1 hr | | 0.8 |
| Example 2-13 | | Air | 100° C., 1 hr | | 0.8 |
| Example 2-14 | | | 200° C., 1 hr | | 0.9 |
| Example 2-15 | | | 200° C., 6 hr | | 0.8 |

| | Annealing | | Electrolytic copper plating | | | Crystal grain refiner (nm) | Adhesion | |
|---|---|---|---|---|---|---|---|---|
| | | | Plating bath | Temperature, time | Annealing | | Peel strength (N/cm) | Evaluation |
| Example 2-7 | Air | 150° C., 1 hr | Copper sulfate | 25° C. 50 min | Ni 180° C., 30 min → 250° C., 30 min → 370° C. 50 min | 80 | 5.0 | A |
| Example 2-8 | | | | | | 77 | 4.8 | A |
| Example 2-9 | | | | | | 75 | 5.1 | A |
| Example 2-10 | | | | | | 78 | 5.0 | A |
| Example 2-11 | | | | | | 75 | 4.0 | A |
| Example 2-12 | Ni | | | | | 76 | 4.0 | A |
| Example 2-13 | Air | | | | | 82 | 1.4 | B |
| Example 2-14 | | | | | | 81 | 1.5 | B |
| Example 2-15 | | | | | | 79 | 2.0 | B |

TABLE 9

| | LPD | | | | | Electroless copper plating | | | |
|---|---|---|---|---|---|---|---|---|---|
| | Type of oxide | Ra (nm) | Film thickness (nm) | Catalyst addition step | Annealing | Crystal grain refiner | | Film thickness (μm) | Rust prevention treatment |
| | | | | | | Type | Concentration (g/L) | | |
| Example 2-16 | Tin oxide | 3 | 30 | Pd | Air 550° C. 1 hr | Ni | 0.05 | 0.8 | Yes |
| Example 2-17 | | | | | | Ni | 0.1 | 0.9 | |
| Example 2-18 | | | | | | Ni | 0.15 | 0.3 | |
| Example 2-19 | | | | | | | | 0.5 | |
| Example 2-20 | | | | | | | | 0.9 | |
| Example 2-21 | | | | | | | | 1.5 | |
| Example 2.22 | | | | | | Ni | 0.3 | 0.9 | |
| Example 2-23 | | | | | | Ni | 0.6 | 0.9 | |
| Example 2-24 | | | | | | Fe | 03 | 0.7 | |
| Example 2-25 | | | | | | Co | 0.3 | 0.7 | |
| Example 2-26 | | | | | | Carboxylic acid | 0.3 | 0.8 | |
| Example 2-27 | | | | | | Amine | 0.3 | 0.8 | |

TABLE 9-continued

| | Annealing | Electrolytic copper plating Plating bath | Electrolytic copper plating Temperature, time | Annealing | Average crystal grain size (nm) | Peel strength (N/cm) | Adhesion Evaluation |
|---|---|---|---|---|---|---|---|
| Example 2-16 | Air 150° C., 1 hr | Copper sulfate | 25° C. 50 min | Ni 180° C., 30 min → 250° C., 30 min → 370° C. 50 min | 91 | 4.3 | A |
| Example 2-17 | | | | | 83 | 4.5 | A |
| Example 2-18 | | | | | 78 | 4.0 | A |
| Example 2-19 | | | | | 78 | 4.5 | A |
| Example 2-20 | | | | | 78 | 5.0 | A |
| Example 2-21 | | | | | 78 | 4.7 | A |
| Example 2-22 | | | | | 81 | 5.0 | A |
| Example 2-23 | | | | | 77 | 4.5 | A |
| Example 2-24 | | | | | 95 | 4.0 | A |
| Example 2-25 | | | | | 94 | 4.0 | A |
| Example 2-26 | | | | | 98 | 4.1 | A |
| Example 2-27 | | | | | 95 | 4.0 | A |

TABLE 10

| | LPD Type of oxide | LPD Ra (nm) | LPD Film thickness (nm) | Catalyst addition step | Annealing | Electroless copper plating Crystal grain refiner Type | Electroless copper plating Crystal grain refiner Concentration (g/L) | Electroless copper plating Film thickness (μm) | Rust prevention treatment |
|---|---|---|---|---|---|---|---|---|---|
| Example 2-28 | Tin oxide | 3 | 30 | Pd | Air 550° C., 1 hr | Ni | 0.3 | 0.8 | Yes |
| Example 2-29 | | | | | | | | 0.8 | No |

| | Annealing | Electrolytic copper plating Plating bath | Electrolytic copper plating Temperature, time | Annealing | Average crystal grain size (nm) | Peel strength (N/cm) | Adhesion Evaluation |
|---|---|---|---|---|---|---|---|
| Example 2-28 | Air 150° C., 1 hr | Copper sulfate | 25° C., 50 min | Ni 180° C., 30 min → 250° C., 30 min → 370° C. 50 min | 78 | 5.0 | A |
| Example 2-29 | | | | | 82 | 2.8 | B |

TABLE 11

| | LPD | | | | | Electroless copper plating | | | |
|---|---|---|---|---|---|---|---|---|---|
| | Type of oxide | Ra (nm) | Film thickness (nm) | Catalyst addition step | Annealing | Crystal grain refiner | | Film thickness (μm) | Rust prevention treatment |
| | | | | | | Type | Concentration (g/L) | | |
| Example 2-30 | Tin oxide | 3 | 30 | Pd | Air 300° C. | Na | 0.3 | 0.8 | Yes |
| Example 2-31 | | | | | | | | 0.8 | |
| Example 2-32 | | | | | | | | 0.9 | |
| Example 2-33 | | | | | | | | 0.8 | |
| Example 2-34 | | | | | | | | 0.8 | |
| Example 2-35 | | | | | | | | 0.7 | |

| | Electrolytic copper plating | | | | Average crystal particle diameter (nm) | Adhesion | |
|---|---|---|---|---|---|---|---|
| | Annealing | Plating bath | Temperature, time | Annealing | | Peel strength (N/cm) | Evaluation |
| Example 2-30 | Air 100° C., 1 hr | Copper sulfate | 25° C. 50 min | Ni | 180° C., 30 min → 250° C., 30 min → 370° C. 50 min | 82 | 4.5 | A |
| Example 2-31 | 150° C., 1 hr | | | | 180° C., 30 min → 300° C., 50 min → 320° C. 20 min | 80 | 5.0 | A |
| Example 2-32 | | | | | 180° C., 30 min → 250° C., 30 min → 370° C. 30 min | 81 | 4.5 | A |
| Example 2-33 | | | | | 180° C., 30 min → 250° C., 30 min → 370° C. 50 min | 84 | 5.0 | A |
| Example 2-34 | | | | | 180° C., 30 min → 250° C., 30 min → 370° C. 120 min | 78 | 5.2 | A |
| Example 2-35 | | | | | 370° C. 50 min (the temperature is increased over a period of 80 min) | 77 | 4.8 | A |

TABLE 12

| | LPD | | | | | Electroless copper plating | | | |
|---|---|---|---|---|---|---|---|---|---|
| | Type of oxide | Ra (nm) | Film thickness (nm) | Catalyst addition step | Annealing | Crystal grain refiner Type | Concentration (g/L) | Film thickness (μm) | Rust prevention treatment |
| Example 2-36 | Tin oxide | 3 | 30 | Pd | Air 300° C., 1 hr | Ni | 0.3 | 0.8 | Yes |
| Example 2-37 | | | | | | | | 0.9 | |
| Example 2-38 | | | | | | | | 0.8 | |
| Example 2-39 | | | | | | | | 0.8 | |
| Example 2-40 | | | | | | | | 0.8 | |
| Example 2-41 | | | | | | | | 0.7 | |
| Example 2-42 | | | | | | | | 0.8 | |

| | Electrolytic copper plating | | | | Average particle diameter (nm) | Adhesion | |
|---|---|---|---|---|---|---|---|
| | Annealing | Plating bath | Temperature, time | Annealing | | Peel strength (N/cm) | Evaluation |
| Example 2-36 | Air 150° C., 1 hr | Copper sulfate | 25° C., 50 min | Ni 180° C., 30 min → 250° C., 30 min → 420° C. 50 min | 78 | 4.8 | A |
| Example 2-37 | | | | 180° C., 30 min → 250° C., 30 min → 520° C. 50 min | 75 | 4.7 | A |
| Example 2-38 | Ni | | | 180° C., 30 min → 250° C., 30 min → 370° C. 50 min | 83 | 5.2 | A |
| Example 2-39 | Air 200° C., 1 hr | | | | 80 | 4.7 | A |
| Example 2-40 | Ni | | | | 75 | 5.0 | A |
| Example 2-41 | Air 250° C., 1 hr | | | | 74 | 4.8 | A |
| Example 2-42 | Ni | | | | 77 | 4.8 | A |

The invention claimed is:

1. A method for producing a plating film to be formed on a glass substrate, comprising:
   (I) step I of bringing a reaction solution containing fluorine and an oxide precursor into contact with a surface of a glass substrate to form an oxide layer on the glass substrate;
   (II) step II of adding a catalyst to the oxide layer;
   (III) step III of removing fluorine in the oxide layer to which the catalyst has been added;
   (IV) step IV of forming an electroless plating film on the oxide layer to which the catalyst has been added; and
   (V) step V of forming an electrolytic copper plating film on the electroless plating film.

2. The method for producing a plating film according to claim 1, wherein removing fluorine in step III is at least one step selected from the group consisting of a step of annealing the oxide layer to which the catalyst has been added and a step of bringing the oxide layer to which the catalyst has been added into contact with an alkaline solution.

3. The method for producing a plating film according to claim 2, wherein the oxide layer comprises at least one element selected from the group consisting of titanium, silicon, tin, zirconium, zinc, nickel, indium, vanadium, chromium, manganese, iron, cobalt, and copper.

4. The method for producing a plating film according to claim 1, wherein the electroless plating film is an electroless copper plating film.

5. The method for producing a plating film according to claim 4, wherein the electroless copper plating film has an average crystal grain size of 500 nm or less.

6. The method for producing a plating film according to claim 5, wherein the oxide layer comprises at least one element selected from the group consisting of titanium, silicon, tin, zirconium, zinc, nickel, indium, vanadium, chromium, manganese, iron, cobalt, and copper.

7. The method for producing a plating film according to claim 4, wherein the oxide layer comprises at least one element selected from the group consisting of titanium, silicon, tin, zirconium, zinc, nickel, indium, vanadium, chromium, manganese, iron, cobalt, and copper.

8. The method for producing a plating film according to claim 1, wherein the electroless plating film is an electroless nickel-phosphorus plating film.

9. The method for producing a plating film according to claim 8, wherein the electroless nickel-phosphorus plating film has a phosphorus content of 4 mass % or more based on the electroless nickel-phosphorus plating film taken as 100 mass %.

10. The method for producing a plating film according to claim 9, wherein the oxide layer comprises at least one element selected from the group consisting of titanium, silicon, tin, zirconium, zinc, nickel, indium, vanadium, chromium, manganese, iron, cobalt, and copper.

11. The method for producing a plating film according to claim 8, wherein the electroless nickel-phosphorus plating film has a thickness of 0.5 μm or more.

12. The method for producing a plating film according to claim 11, wherein the oxide layer comprises at least one element selected from the group consisting of titanium, silicon, tin, zirconium, zinc, nickel, indium, vanadium, chromium, manganese, iron, cobalt, and copper.

13. The method for producing a plating film according to claim 8, wherein the oxide layer comprises at least one element selected from the group consisting of titanium, silicon, tin, zirconium, zinc, nickel, indium, vanadium, chromium, manganese, iron, cobalt, and copper.

14. The method for producing a plating film according to claim 1, wherein the oxide layer comprises at least one element selected from the group consisting of titanium, silicon, tin, zirconium, zinc, nickel, indium, vanadium, chromium, manganese, iron, cobalt, and copper.

* * * * *